United States Patent
Lynde et al.

(10) Patent No.: US 11,287,484 B2
(45) Date of Patent: Mar. 29, 2022

(54) METHOD AND APPARATUS FOR TRIAGE OF ELECTRONIC ITEMS USING MAGNETIC FIELD DETECTION

(71) Applicant: INNOVAURA CORPORATION, Camano Island, WA (US)

(72) Inventors: C. MacGill Lynde, Bellevue, WA (US); Derek Platt, Edmonds, WA (US); Christopher A. Wiklof, Everett, WA (US); Alan Corwin, Tacoma, WA (US); Ronald Schoenberg, Burien, WA (US)

(73) Assignee: Innovaura Corporation, Camano Island, WA (US)

( * ) Notice: Subject to any disclaimer, the term of this patent is extended or adjusted under 35 U.S.C. 154(b) by 0 days.

(21) Appl. No.: 17/207,203

(22) Filed: Mar. 19, 2021

(65) Prior Publication Data
US 2021/0278482 A1    Sep. 9, 2021

Related U.S. Application Data

(63) Continuation of application No. 17/031,354, filed on Sep. 24, 2020, now abandoned, which is a
(Continued)

(51) Int. Cl.
*G01R 33/00* (2006.01)
*H04B 17/00* (2015.01)
(Continued)

(52) U.S. Cl.
CPC ..... *G01R 33/0023* (2013.01); *G01R 33/0094* (2013.01); *G06T 7/70* (2017.01); *H04B 17/0085* (2013.01); *G06F 3/14* (2013.01)

(58) Field of Classification Search
CPC .. G01R 33/0023; G01R 33/0094; G06T 7/70; H04B 17/0085; G06F 3/14
(Continued)

(56) References Cited

U.S. PATENT DOCUMENTS

| 6,736,978 B1 | 5/2004 | Porter et al. |
| 2010/0123453 A1 | 5/2010 | Pauly et al. |

(Continued)

FOREIGN PATENT DOCUMENTS

| JP | 09-243725 A | 9/1997 |
| JP | 2006-349496 A | 12/2006 |

(Continued)

OTHER PUBLICATIONS

International Search Report and Written Opinion for International Application No. PCT/US2015014325 dated May 11, 2015, 19 pgs.
(Continued)

*Primary Examiner* — Giovanni Astacio-Oquendo
(74) *Attorney, Agent, or Firm* — Christopher A. Wiklof; Launchpad IP, Inc.

(57) ABSTRACT

An electronic circuit triage device diagnoses functionality of various electronic circuits of an electronic device. The electronic circuit triage device detects whether an electronic circuit is functioning properly by measuring a magnetic field pattern associated with the electronic circuit and comparing the magnetic field pattern to an expected magnetic field pattern.

A magnetic sensor array includes non-packaged magnetic sensors disposed on a substrate. The non-packaged magnetic sensors can include bare dice, in one embodiment. In another embodiment, the magnetic sensors are formed directly on the substrate, such as by printing conductive traces on the substrate. In another embodiment, a magnetic sensor array includes a magnetic field converter configured to launch received magnetic fields along an axis corresponding to a magnetic sensor maximum sensitivity.

23 Claims, 22 Drawing Sheets

Related U.S. Application Data continuation-in-part of application No. PCT/US2019/034892, filed on May 31, 2019, application No. 17/207,203, which is a continuation of application No. 17/031,354, filed on Sep. 24, 2020, now abandoned, which is a continuation-in-part of application No. 15/227,122, filed on Aug. 3, 2016, now Pat. No. 10,838,020, which is a continuation of application No. PCT/US2015/014325, filed on Feb. 3, 2015.

(60) Provisional application No. 62/678,386, filed on May 31, 2018, provisional application No. 61/935,178, filed on Feb. 3, 2014.

(51) Int. Cl.
  *G06T 7/70* (2017.01)
  *G06F 3/14* (2006.01)

(58) Field of Classification Search
  USPC .......................................... 324/244, 239, 200
  See application file for complete search history.

(56) References Cited

U.S. PATENT DOCUMENTS

| | | |
|---|---|---|
| 2013/0265039 A1 | 10/2013 | Cai et al. |
| 2015/0130480 A1 | 5/2015 | Berkcan et al. |
| 2015/0221057 A1* | 8/2015 | Raheja ............ G06Q 10/06311 705/2 |
| 2016/0187418 A1* | 6/2016 | Wang ................. G01R 31/2868 324/750.05 |
| 2016/0197382 A1* | 7/2016 | Sood ...................... G01N 29/26 429/92 |
| 2016/0306012 A1 | 10/2016 | Pinto et al. |
| 2016/0377654 A1* | 12/2016 | Cocchini ........... G01R 1/06744 324/750.2 |
| 2017/0116677 A1* | 4/2017 | Gray ...................... G06Q 40/08 |
| 2019/0044966 A1* | 2/2019 | Vega ...................... G06F 9/455 |

FOREIGN PATENT DOCUMENTS

| | | |
|---|---|---|
| JP | 2010-014701 A | 1/2010 |
| KR | 10-2018-0024404 A | 3/2018 |
| WO | 2015-074005 A1 | 5/2015 |

OTHER PUBLICATIONS

International Preliminary Report on Patentability for International Application No. PCT/US2015/014325 dated Aug. 9, 2016, 15 pgs.
International Search Report and Written Opinion for International Application No. PCT/US2019/034892 dated Sep. 18, 2019, 15 pgs.
International Preliminary Report on Patentability for International Application No. PCT/US2019034892 dated Dec. 1, 2020, 11 pgs.

\* cited by examiner

METHOD AND APPARATUS FOR TRIAGE OF ELECTRONIC ITEMS USING MAGNETIC FIELD DETECTION

SUMMARY

It has been found that operation (or non-operation) of circuitry of an electronic product can be detected by magnetic fields emitted from the product. For example, a cell phone exhibiting problematic operation may be brought to a service center. The service center technician can place the cell phone on a surface aligned to a magnetic detector array. If the battery is discharged or charged, the magnetic field exhibits a respective pattern. If the charging circuit is operational or not operational, the magnetic field exhibits a respective pattern. By doing triage on a device when the device is received, the technician may more accurately advise the user as to repair cost and time (or if no fault is detected, the technician may advise the user to replace an external power supply or cable).

According to an embodiment, a method for performing triage on an electronic device includes receiving into a test system from an interface a model designator for an electronic device, fetching one or more reference magnetic field patterns corresponding to the electronic device, and receiving the electronic device on a test platform. The method includes measuring a magnetic field pattern proximate to and relative to the electronic device, comparing the measured magnetic field pattern to the one or more reference magnetic field patterns, and inferring a condition of the electronic device as a function of correspondence of the measured magnetic field pattern to the one or more reference magnetic field patterns. The method includes outputting the inferred condition to a user.

According to an embodiment, a system for performing triage on an electronic apparatus includes a user interface configured to receive input of an electronic device model designator and output an inferred condition of the electronic device to a user. The system includes a computer memory configured to hold one or more reference magnetic field patterns corresponding to the electronic device model. The system includes a test platform configured to receive and support the electronic device. The system includes one or more magnetic sensor arrays configured to detect a magnetic field strength and direction at each of a plurality of array locations proximate to an electronic device holding volume adjacent to the test platform. The system includes a microprocessor operatively coupled to the computer memory, the user interface, and the one or more magnetic sensor arrays. The microprocessor is configured to execute computer instructions to interrogate and receive the magnetic field strengths and directions from each of the plurality of magnetic sensors and compare one or more received magnetic field patterns corresponding to the received magnetic field strengths and directions to the one or more reference magnetic field patterns corresponding to the electronic device model. The microprocessor is configured to execute computer instructions to infer a condition of the electronic device by selecting a best fit between the one or more received magnetic field patterns and the one or more reference magnetic field patterns and output the inferred condition to the user via the user interface.

According to an embodiment, a method includes receiving an electronic device on a test platform of an electronic circuit triage system, measuring a magnetic field pattern from the electronic device, and comparing the measured magnetic field pattern to one or more reference magnetic field patterns. The method includes determining a condition of the electronic device based on the comparison of the measured magnetic field pattern to the one or more reference magnetic field patterns, and outputting an indication of the condition to a user.

According to an embodiment, an electronic triage system includes a test platform configured to receive an electronic device, and one or more arrays of magnetic sensors collectively positioned configured to sense magnetic field characteristics indicative of a magnetic field pattern from the electronic device when the electronic device is positioned on the test platform. The electronic triage system includes a microprocessor coupled to the magnetic sensor and configured to compare the magnetic field pattern to one or more reference magnetic field patterns and to diagnose a condition of the electronic device based on comparison of the magnetic field pattern to the one or more reference magnetic field patterns.

According to an embodiment, a magnetic sensor or magnetometer array includes a substrate, a sensor array interface disposed on the substrate, a plurality of sensors disposed on the substrate, and a sensor interface circuit disposed on the substrate and configured to operatively couple the plurality of magnetic sensors to the sensor array interface.

According to an embodiment, a magnetic sensor array includes a plurality of magnetic field sensors disposed on a substrate and configured to detect magnetic field components parallel to the substrate. According to an embodiment, a magnetic field converter guides a magnetic field component along its surface to cause a magnetic field component normal to the substrate to be detected by a magnetic field sensor configured to detect magnetic field components parallel to the substrate.

According to an embodiment, a magnetic sensor array includes a plurality of magnetic field sensors disposed on a substrate and configured to detect magnetic field components normal to the substrate. According to an embodiment, a magnetic field converter guides a magnetic field component along its surface to cause a magnetic field component parallel to the substrate to be detected by a magnetic field sensor configured to detect magnetic field components normal to the substrate.

According to an embodiment, a magnetic sensor array includes a plurality of unpackaged magnetic field sensor devices disposed on a substrate. In an embodiment, the plurality of unpackaged magnetic field sensor devices include respective subsets configured to sense a magnetic field component along an x-axis parallel to the substrate, a magnetic field component along a y-axis parallel to the substrate, and a magnetic field component along a z-axis normal to the substrate.

According to an embodiment, a magnetic sensor array includes a plurality of unpackaged magnetic field sensor devices disposed on a substrate, the magnetic sensor array including a subset configured to detect a magnetic field component along an x-axis parallel to the substrate and another subset configured to detect a magnetic field component along a y-axis perpendicular to the x-axis and parallel to the substrate. According to an embodiment, the magnetic sensor array is operatively coupled to a magnetic field converter configured to cause a portion of the x-axis magnetic field sensors to detect magnetic field components from both the x-axis and from the z-axis normal to the substrate. According to an embodiment, the magnetic sensor array is operatively coupled to a magnetic field converter configured to cause a portion of the y-axis magnetic field sensors to detect magnetic field components from both the y-axis and from the z-axis.

According to an embodiment, a magnetic field sensor system includes a signal processor operatively coupled to each of the magnetic field sensors. The signal processor is configured to extract from sensor output sensed magnetic field components corresponding to z-axis from sensed magnetic field components corresponding to the x- and y-axes.

According to an embodiment, a magnetic sensor array includes a plurality of magnetic sensors formed on a substrate. In one embodiment, the magnetic sensors are formed from a conductive thick film paste deposited and cured on the substrate. For example, the conductive thick film paste can be screen printed or pad printed.

In an embodiment, a magnetic sensor array can be formed on a flexible substrate. In an embodiment, a magnetic sensor array can be formed on a curved substrate.

According to an embodiment, a method for operating a magnetic sensor array includes, for each of a plurality of magnetometers in a magnetic sensor array, receiving a magnetic field having a magnetic field component along a first axis, guiding the magnetic field component with a magnetic field converter from the first axis to a second axis, receiving the magnetic field along the second axis with the magnetometer, and outputting a signal or data proportional to the received magnetic field strength along the second axis from the magnetometer through a sensor interface circuit to a sensor array interface. The method can further include receiving a plurality of data or signals corresponding to the plurality of magnetometers from the sensor array interface into a magnetic pattern analysis circuit and generating an image of a magnetic field pattern corresponding to the received magnetic field at each of a plurality of magnetometer locations in the magnetic sensor array.

According to an embodiment, a method for making a magnetic sensor array includes providing a substrate including a sensor interface circuit, affixing a plurality of magnetometers at respective predetermined locations to the substrate, electrically coupling each of the magnetometers to the sensor interface circuit, and coupling a sensor array interface to the sensor interface circuit. The plurality of magnetometers can be unpackaged magnetometers.

According to an embodiment, an electronic device test system includes a magnetometer array including a plurality of magnetometers aligned to receive an instantaneous magnetic field pattern from an electronic device in a magnetic field measurement region, and a test circuit configured to receive signals or data from the magnetometer array and to output, to an analysis device, magnetic field data corresponding to the received signals or data. The analysis device includes a computer application configured to diagnose one or more hardware defects in the electronic device as a function of the magnetic field data.

DETAILED DESCRIPTION

Figure 1:
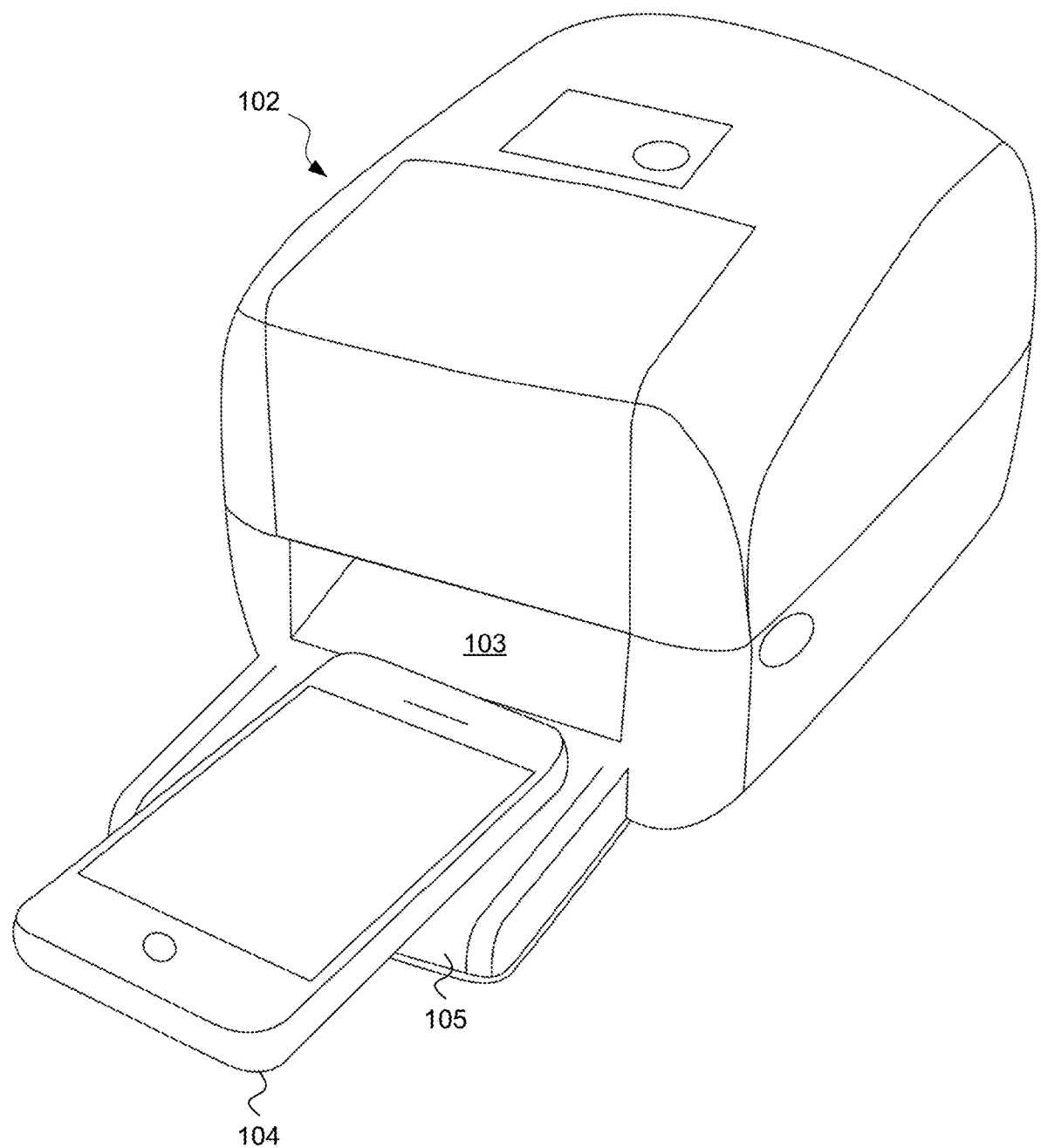
FIG. 1 is an illustration of an electronic circuit triage system, according to an embodiment.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

FIG. 1 is an illustration of an electronic circuit triage system 102, according to an embodiment. The electronic circuit triage system 102 is configured to perform triage on an electronic device 104. In particular, the electronic circuit triage system 102 is configured to analyze an electromagnetic field generated by electronic circuits or circuit blocks of the electronic device 104 in order to ascertain how each electronic circuit or circuit block of the electronic device 104 is functioning. In this way, the electronic circuit triage system 102 can determine which, if any, electronic circuits or circuit blocks of the electronic device 104 is not functioning properly.

According to an embodiment, the electronic circuit triage system 102 operates on the principle that, in many cases, an electronic circuit generates an electromagnetic field that is typical of the electronic circuit. This electromagnetic field can be used as a type of "fingerprint" of that particular electronic circuit. The electronic circuit triage system 102 can measure the electromagnetic fields of the various electronic circuits or circuit blocks of the electronic device 104 and can detect whether or not the electromagnetic fields of the electronic circuits align with the expected electromagnetic fields of the electronic circuits. If the electromagnetic field of a particular electronic circuit is different than the expected electromagnetic field generated by that electronic circuit, then the electronic circuit triage system 102 determines that the electronic circuit is not functioning correctly. In this way, the electronic circuit triage system 102 captures the electromagnetic fingerprint and uses 3-D image analysis to determine whether the electromagnetic fingerprint corresponds to a correctly functioning circuit.

According to an embodiment, the electronic circuit triage system 102 utilizes an array of magnetic sensors in order to measure, for each electronic circuit of the electronic device 104, the magnetic field pattern generated by that electronic circuit. The electronic device 104 can be placed on a designated sensing area of the electronic circuit triage system 102. The magnetic sensors can be positioned to detect magnetic fields generated by the electronic device 104 while the electronic device 104 is positioned on the designated sensing area.

In one embodiment, the designated sensing area can be on a tray 105 of the electronic circuit triage system 102. The electronic device 104 can be placed on the tray 105. The tray 105 can include an array of magnetic sensors therein, for example below a top surface of the tray 105. When the electronic device 104 is placed in the tray 105, the magnetic sensors of the electronic circuit triage system 102 are in a position relative to the electronic device 104 to measure the magnetic field generated by the electronic circuit of the electronic device 104.

In one embodiment, the designated sensing area is in an interior area of the electronic device 104, such as within a slot 103. The electronic device 104 can be positioned on the tray 105 and then slid into the slot 103. The magnetic sensors are positioned to detect the magnetic fields generated by the electronic device 104 when the electronic device 104 is positioned within the slot 103. When the electronic device 104 is placed in the slot 103, the magnetic sensors of the electronic circuit triage system 102 are in a position relative to the electronic device 104 to measure the magnetic field generated by an electronic circuit of the electronic device 104.

In one embodiment, the array of magnetic sensors can include respective sensors for measuring magnetic fields in each of 3 mutually orthogonal dimensions. These dimensions can be designated X, Y, and Z dimensions. Alternatively, the magnetic sensors can include respective sensors for measuring magnetic fields in fewer than 3 dimensions.

In one embodiment, each magnetic sensor can include an inductor coil aligned to detect a magnetic field component in a respective direction such as the X, Y, or Z direction. The magnetic sensors can include MEMS magnetic sensors, magnetoresistive sensors, hall effect sensors, pulsed field extraction magnetometers, torque magnetometers, faraday force magnetometers, optical magnetometers, or other types of magnetic sensors.

According to an embodiment, the electronic circuit triage system 102 is configured to perform triage on each of a plurality of electronic circuits of the electronic device 104, in sequence. In an example in which the electronic device 104 is a mobile phone, the electronic circuit triage system 102 can measure the magnetic field of each of the plurality of electronic circuits including a flash memory array, a display, an applications processor, a dynamic random access memory (DRAM), a baseband radio processor, power and wire, a touch controller, a global positioning system (GPS), an image sensor, a power monitor circuit (PMC), or other electronic circuits or circuit blocks of the mobile phone. The electronic circuit triage system 102 can test each of these electronic circuits in sequence and can provide diagnosis of the functionality of each of these electronic circuits based on whether or not their respective magnetic fields align with expected magnetic fields.

According to an embodiment, the electronic circuit triage system 102 is configured to perform triage for one or more of mobile phones, tablets, laptops, medical devices, aviation circuitry, automobile circuitry, or other kinds of electronic devices 104 and electronic circuitry. In some cases, the electronic circuit triage system 102 can be brought to a location of electronic devices 104 that are not easily moved in order to test the electronic devices 104. In other cases, the electronic devices 104 can be brought to the electronic circuit triage system 102 in order to receive triage services from the electronic circuit triage system 102. Thus, the electronic circuit triage system 102, in accordance with principles of the present disclosure, can be utilized in a large variety of ways to measure a large variety of electronic devices 104.

Figure 2:
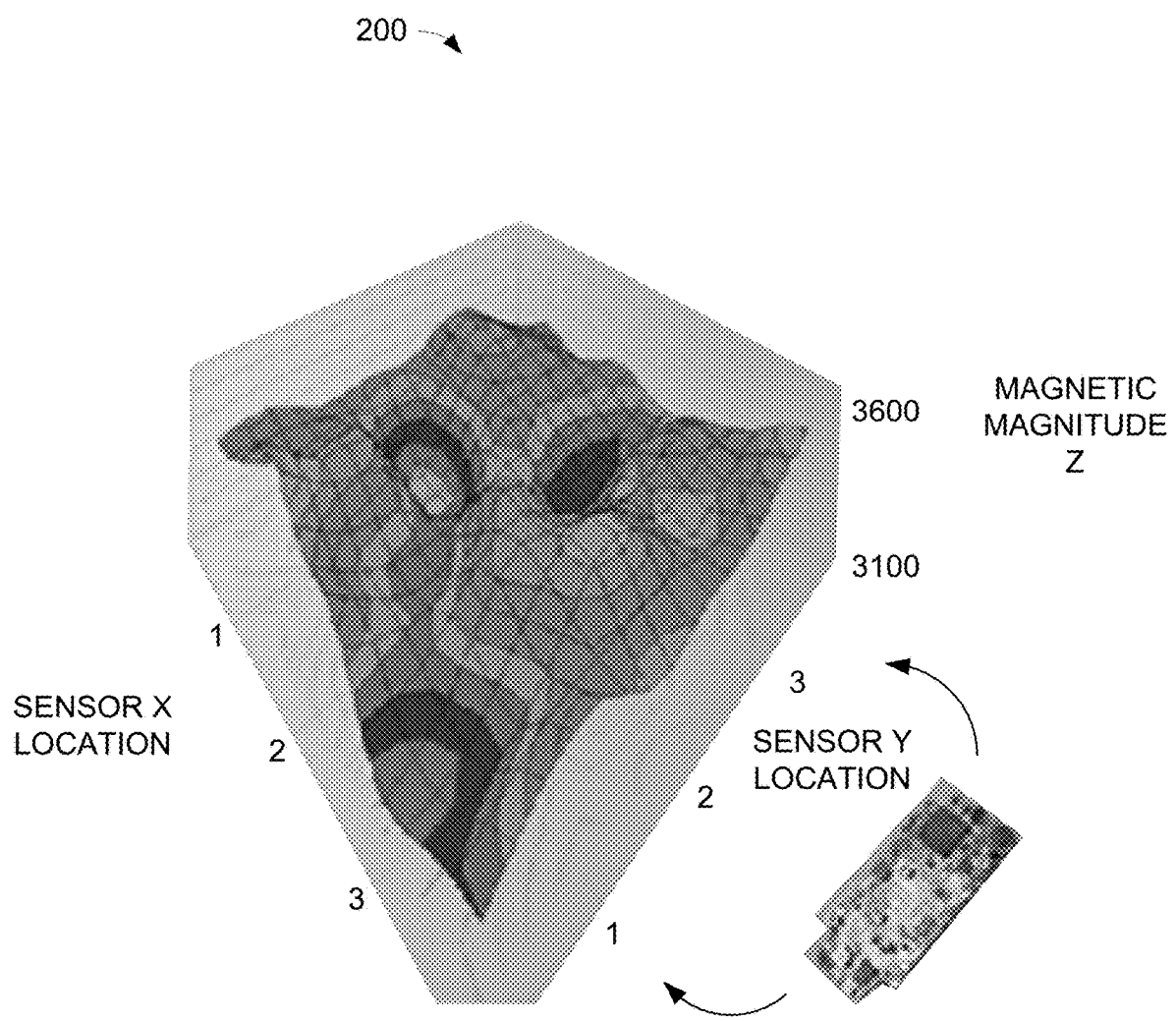
FIG. 2 is an illustration of a magnetic field pattern image, according to an embodiment.

FIG. 2 is an illustration of a magnetic field pattern image 200, according to an embodiment. The magnetic field pattern image 200 indicates the magnitude of the vector in the X, Y, Z dimensions of the magnetic field generated by an electronic circuit of the electronic device 104. The magnetic field pattern image 200 indicates that the magnetic sensors of the electronic circuit triage system 102 include an array of three sensors spaced along the X-axis and three sensors spaced on the Y-axis. When the electronic device 104 is positioned in the designated sensing area of the electronic circuit triage system 102, the sensors are able to sense the magnetic field generated by whichever electronic circuit of the electronic device 104 currently under test. The electronic circuit triage system 102 can then generate the 3-D magnetic field pattern image 200 representing the profile of the magnetic field generated by the electronic circuit of the electronic device 104.

Those of skill in the art will recognize, in light of the present disclosure, that other arrays and combinations of magnetic sensors can be utilized to measure the magnetic field pattern of an electronic circuit. A magnetic field pattern could indicate the strength of the magnetic field in multiple axes, for example 2 or more of the X, Y, and Z axes. The electronic circuit triage system 102 can include other kinds of sensors, including electric field sensors in order to generate an electromagnetic field pattern for triage purposes. All such other combinations of sensors and types of electromagnetic profile images fall within the scope of the present disclosure.

Figure 3:
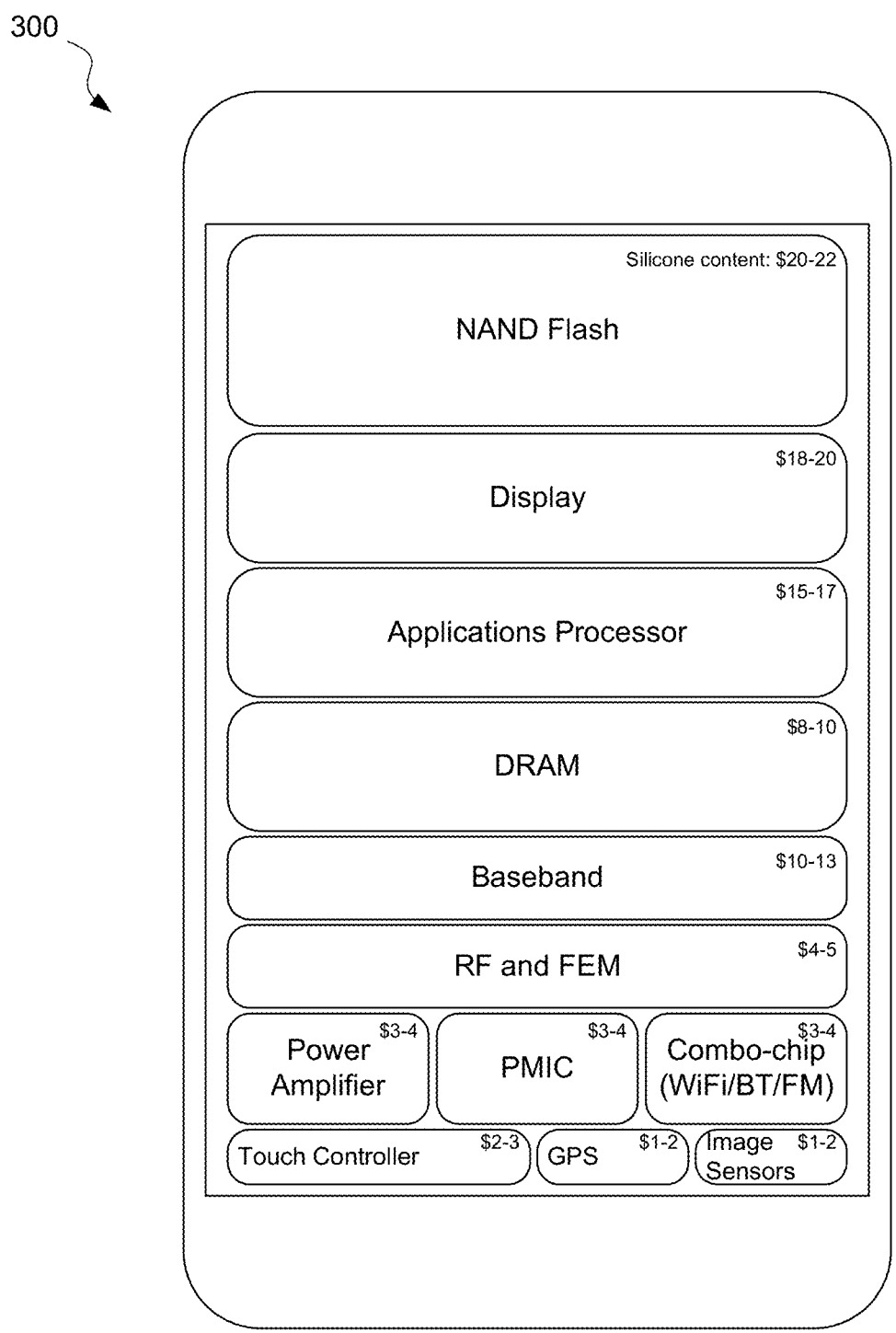
FIG. 3 is a testing control object of an electronic device, according to an embodiment.

FIG. 3 is a testing control object 300 of an electronic device 104. In the example of FIG. 3, the testing control object 300 is of a mobile phone. The testing control object 300 can be displayed by the electronic circuit triage system 102 in order to allow a user or technician to select which electronic circuit or circuit blocks of the mobile phone should be tested. The testing control object 300 can be displayed on a display of the electronic circuit triage system 102 as part of a graphical user interface. The technician or user can select, for testing, an electronic circuit or component of the electronic device 104 by selecting the corresponding block on the testing control object 300 via the graphical user interface.

Today's mobile phones have modules or components. Each module represents a complex circuit designed to perform a separate function. The electronic circuit triage system 102 recognizes the electromagnetic fields created by each module. The electronic circuit triage system 102 can rapidly distinguish when modules are not operating properly, regardless of whether or not the display is working.

According to an embodiment, the user or technician can select one or more of the electronic circuits, such as the NAND Flash, the display, the applications processor, the DRAM, the baseband processor, the radiofrequency (RF) and the front end module (FEM) circuitry, the power amplifier, the power management integrated circuit (PMIC), the combo-chip, the touch controller, the GPS, or the image sensors. Each of these modules can have a separate price for testing the module. If a customer brings a mobile phone to be tested, the electronic circuit triage system 102 can display the testing control object 300 and allow the user to select which electronic circuits, circuit blocks, or modules of the mobile phone should be tested. The price can correspond to the electronic circuits selected by the user. The electronic circuit triage system 102 can then proceed to test the selected circuits.

According to an embodiment, the electronic circuit triage device 102 can receive electromagnetic signals from the mobile phone and can compare the electromagnetic signals to electromagnetic signals corresponding to known failure modes in order to determine the functionality of each of the modules selected for testing.

According to an embodiment, the mobile phone, or other electronic device 104 to be tested, can include a companion software application that can be activated to initiate a diagnostic mode to assist the electronic circuit triage system 102 to test the various circuits or modules. The companion software application can be initiated through specific hardware button press combinations. Once the companion software application has been initiated, the companion software application can cause the mobile phone to generate a unique electromagnetic signal indicating to the electronic circuit triage system 102 that the mobile phone is active. The companion software application can activate separate circuits or modules of the mobile phone to assist in the diagnostic process performed by the electronic circuit triage system 102. The companion software application can activate the separate circuits or modules responsive to manipulation of hardware buttons or other hardware controls of the mobile phone. In particular, the companion software application can activate the separate circuits or modules responsive to combinations of hardware button presses. Additionally or alternatively, the companion software application can activate the separate circuits or modules responsive to signals received from the electronic circuit triage system 102. Additionally or alternatively, the companion software application can activate the separate circuits or modules in an order set forth by the companion software application. The companion software application can be utilized by electronic devices 104 other than mobile phones.

Figure 4:
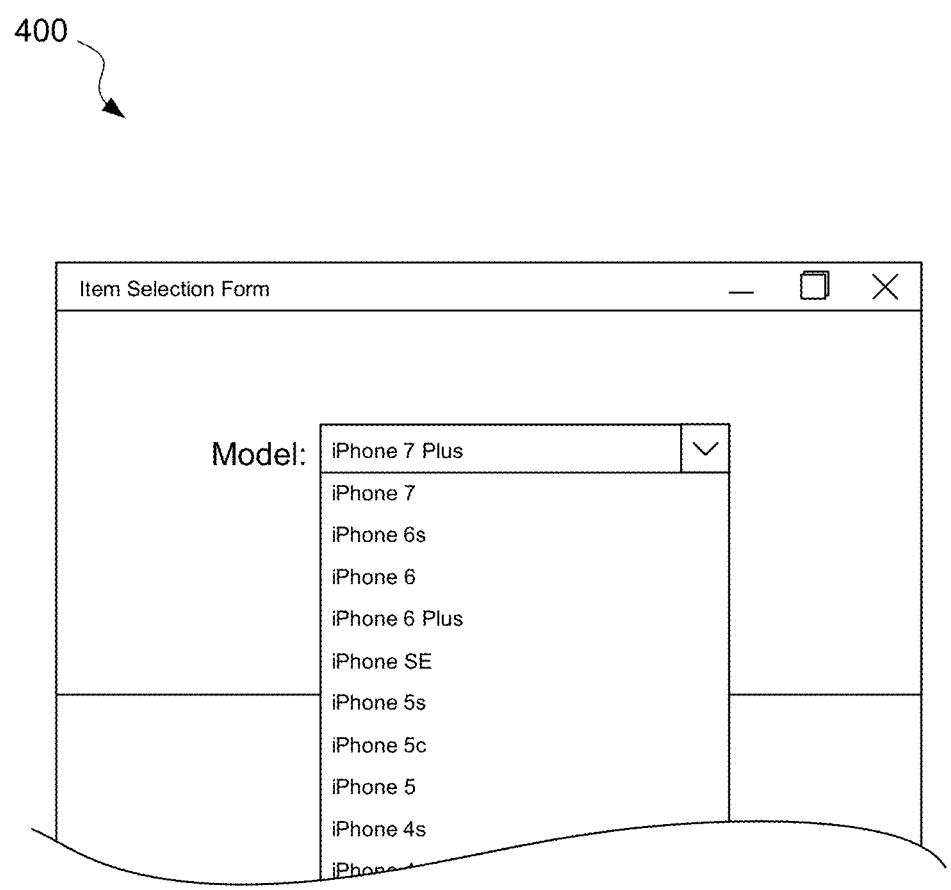
FIG. 4 is an illustration of a user interface of an electronic circuit triage system, according to an embodiment.

FIG. 4 is an illustration of a user interface 400 of an electronic circuit triage system 102, according to an embodiment. The user interface 400 allows the user or technician to select one of a large variety of mobile phone models to be tested. The electronic circuit triage system 102 includes the capability to test the electronic circuits of each of the mobile phones that can be selected through the user interface 400.

The electronic circuit triage system 102 can include in its internal memory data related to the electromagnetic field patterns expected for each of the electronic circuits of the various models of mobile phones. The user can select the correct model of mobile phone and insert the mobile phone into the test platform of the electronic circuit triage system 102. The electronic circuit triage system 102 can then test one or more of the electronic circuits of the mobile phone.

In one example, a customer's mobile phone is blank and appears unresponsive. The customer, or a technician, can place the mobile phone in the designated receiving area of the electronic circuit triage system 102. The customer or the technician can select various tests to be performed. The electronic circuit triage system 102 may first test the battery, to determine whether or not the battery carries a charge. If the battery carries a charge, it will have a certain kind of electromagnetic field. A battery that does not carry a charge will have a different kind of electromagnetic field. The electronic circuit triage system 102 may then test charging circuitry of the mobile phone while a charging cable is attached and may test whether the charging circuitry is active, and if the charging circuitry is active, whether or not the charging circuitry is behaving normally. The electronic circuit triage system 102 may then do a power on test and determine whether the power on sequence is normal when the power on button is pressed. Next, the electronic circuit triage system 102 can perform baseband tests and determine whether the cellular radio is on, and if so, whether the response is normal. The baseband tests can include testing whether the Wi-Fi is on and whether the Wi-Fi response is normal. The baseband tests can include whether the Bluetooth is on and whether the Bluetooth response is normal. Based on these baseband tests, the electronic circuit triage system 102 can determine whether or not these electronic circuits of the mobile phone are functioning properly. The diagnosis from these tests can determine whether the mobile phone should be shipped to a manufacturer for repair, whether the mobile phone can be repaired at a local repair shop, whether installing a new battery or purchasing new charging cables will fix an issue, or whether other kinds of action should be taken. This can save the customers and the manufacturers time and money.

Figure 5:
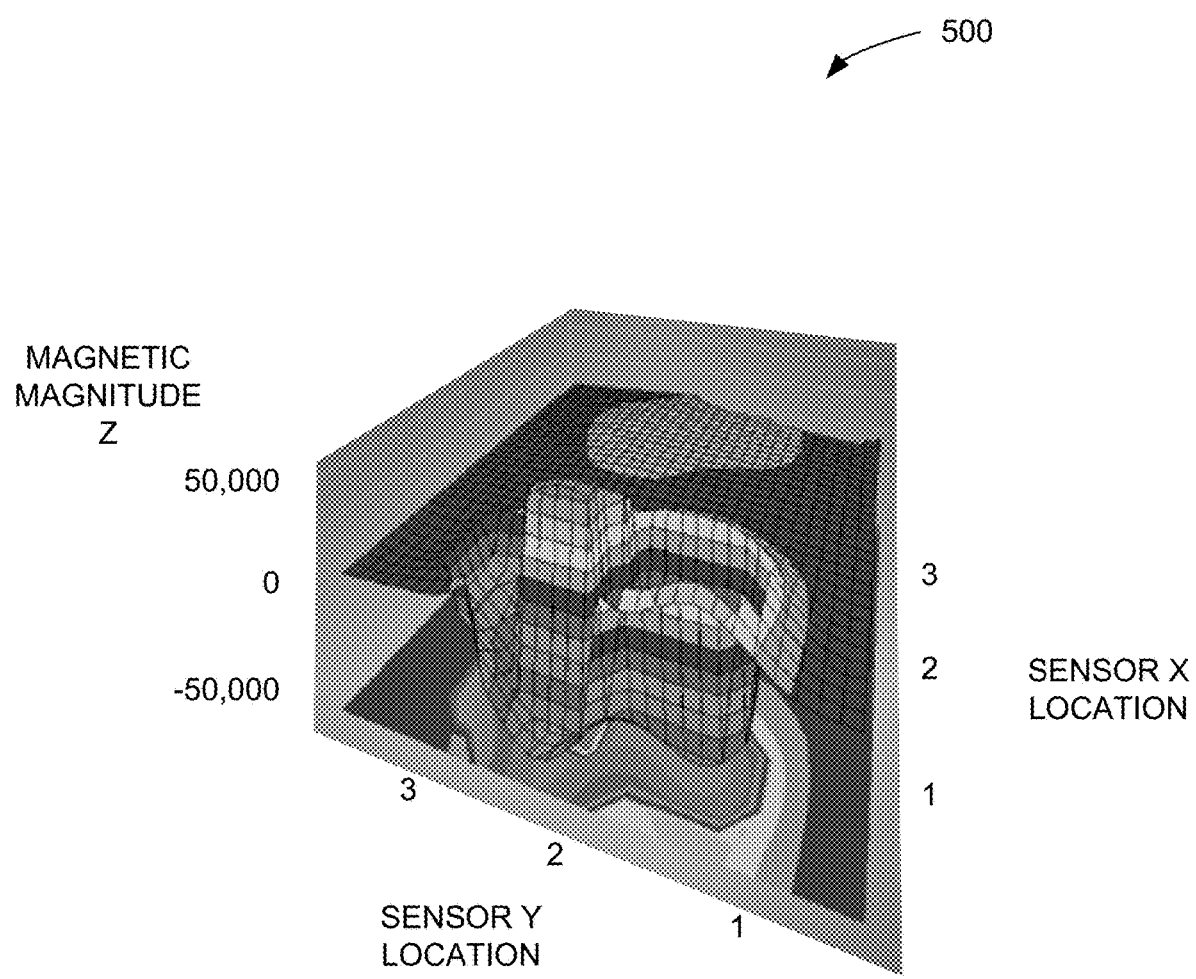
FIG. 5 is an illustration of a magnetic field pattern image, according to an embodiment.

FIG. 5 is an illustration of a magnetic field pattern image 500, according to an embodiment. The magnetic field pattern image 500 was captured from a particular mobile phone with the Bluetooth and the Wi-Fi circuits on, while the screen and the cellular circuits were off. The magnetic field pattern image 500 indicates the magnitude of the magnetic field vector in the X, Y, Z dimensions generated by an electronic circuit of the electronic device 104.

Figure 6:
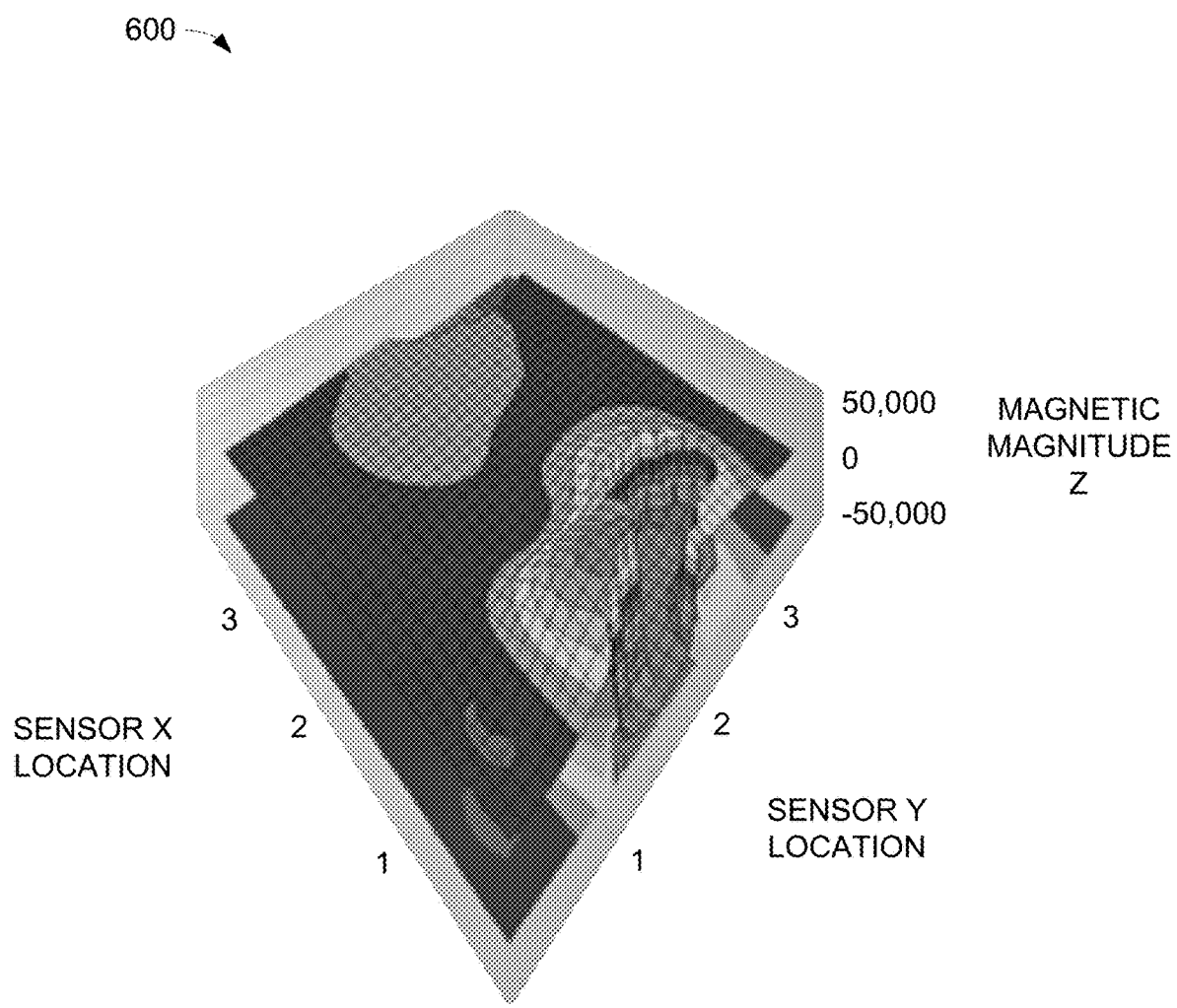
FIG. 6 is an illustration of a magnetic field pattern image, according to an embodiment.

FIG. 6 is an illustration of a magnetic field pattern image 600, according to an embodiment. The magnetic field pattern image 600 indicates the magnetic field vector in the X, Y, Z dimensions generated by an electronic circuit of the electronic device 104.

Figure 7:
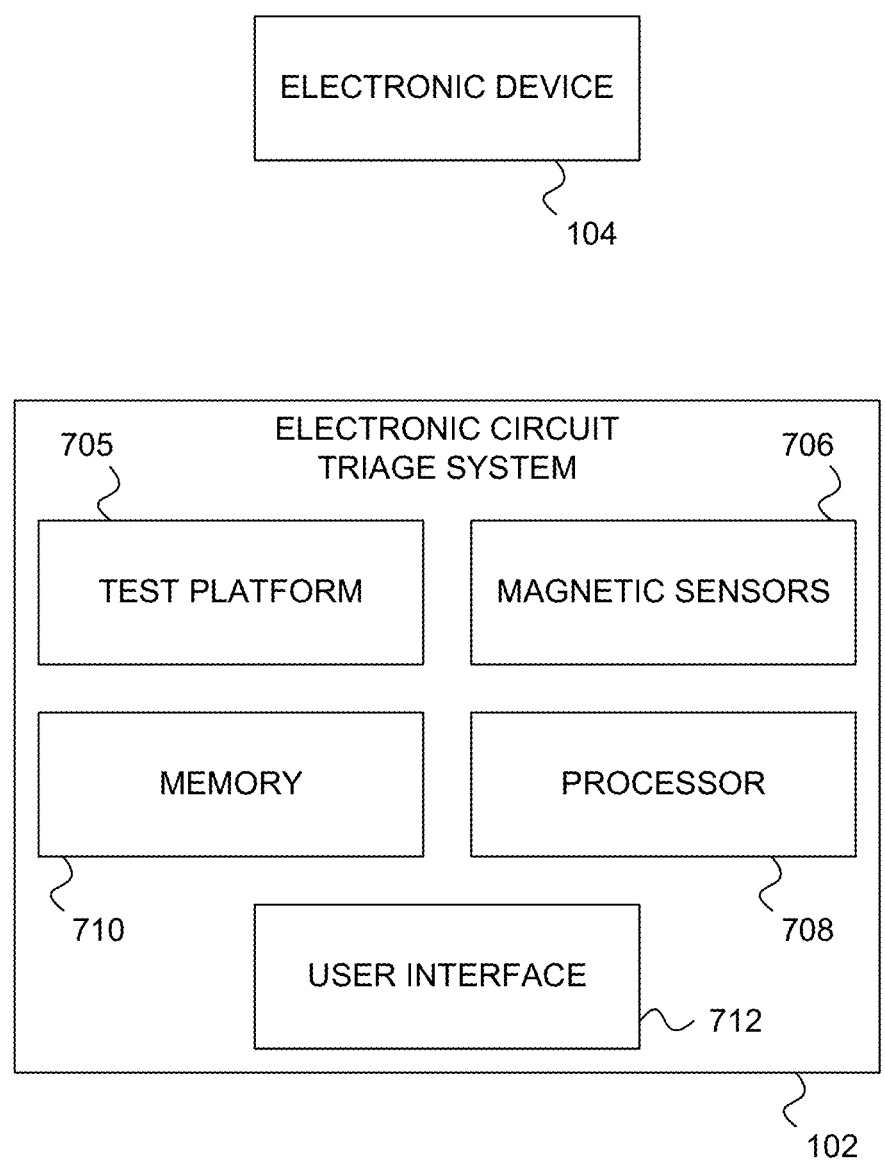
FIG. 7 is a block diagram of an electronic circuit triage system, according to an embodiment.

FIG. 7 is a block diagram of an electronic circuit triage system 102, according to an embodiment. The electronic circuit triage system 102 is configured to perform triage on an electronic device 104 in order to diagnose a condition of one or more electronic circuits within the electronic device 104.

According to an embodiment, the electronic circuit triage system 102 includes a test platform 705, an array of magnetic sensors 706, a processor 708, a memory 710, and a user interface 712. The electronic circuit triage system 102 utilizes these components in order to perform triage on the electronic device 104. In particular, the electronic circuit triage system 102 is configured to enable a user or a technician to operate the electronic circuit triage system 102 in order to perform triage on the electronic device 104 and to receive information from the electronic circuit triage system 102 indicating a state of operability of one or more electronic circuits of the electronic device 104.

According to an embodiment, the electronic circuit triage system 102 includes the test platform 705. The test platform 705 is an area configured to receive the electronic device 104 in order to perform triage on the electronic device 104. The test platform 705 can include one or more of a tray on which the electronic device 104 can be placed, a slot in which the electronic device 104 can be placed, an interior volume of the electronic circuit triage system 102 in which the electronic device 104 can be placed, a pad, receiving grooves, a stand, a niche, or any other suitable receiving area at which the electronic device 104, or a portion of the electronic device 104, can be placed. The test platform 705 can be sized to accommodate a large variety of electronic devices 104. Alternatively, the test platform 705 can be sized to accommodate a certain type and general size of the electronic device 104.

According to an embodiment, the electronic circuit triage system 102 can include a housing that is magnetically shielded from external electromagnetic signals or interference. This shielding can inhibit external electromagnetic signals from interfering with the diagnostic processes being performed on the electronic device 104 positioned on or in the test platform 705. This can result in a more accurate diagnostic process. Alternatively or additionally, the electronic circuit triage system 102 can include other types of shielding to inhibit the external electromagnetic signals from interfering with the diagnostic processes. In an embodiment, the test platform 705 is positioned within magnetic shielding (formed as part of or disposed within the housing) including a high magnetic permeability material selected to form a low reluctance path around the test platform 705, the electronic device 104, and the array of magnetic sensors 706 for low frequency or static external magnetic fields. For example, the high magnetic permeability material may include mu-metal.

According to an embodiment, the electronic circuit triage system 102 utilizes the array of magnetic sensors 706 in order to diagnose whether one or more of the electronic circuits of the electronic device 104 are functioning properly. The array of magnetic sensors 706 are positioned so that when the electronic device 104 is placed in the designated receiving area, such as on the test platform 705, the array of magnetic sensors 706 can sense the parameters of a magnetic field generated by the electronic device 104. The parameters of the magnetic field generated by the electronic device 104 can indicate a functional state of one or more of the electronic circuits of the electronic device 104. The array of magnetic sensors 706 generate sensor signals that indicate the parameters of the magnetic field generated by the electronic device 104. A magnetic field pattern can be generated or derived based on the sensor signals. The magnetic field pattern can provide an indication of the functionality of one or more of the electronic circuits of the electronic device 104.

According to an embodiment, the memory 710 stores data related to the functionality of the electronic circuit triage system 102. The data can include software instructions for executing the various functions of the electronic circuit triage system 102. The memory 710 can also store magnetic field reference data. The magnetic field reference data can include data related to a plurality of reference magnetic field patterns. The reference magnetic field patterns correspond to known magnetic field patterns for states of operability of various electronic circuits of a large number of electronic devices 104.

According to an embodiment, the electronic circuit triage system 102 can be configured to perform triage on various models of mobile phones. Each model of mobile phone may have several electronic circuits, or circuit blocks, whose functionality can be tested. The memory 710 stores reference magnetic field patterns for each electronic circuit or circuit block of each model of mobile phone. The memory 710 can store multiple reference magnetic field patterns for each electronic circuit or circuit block. The multiple reference magnetic field patterns for each electronic circuit or circuit block correspond to various states of operability of the electronic circuit or circuit block. For example, for a given electronic circuit or circuit block, the memory 710 can store the reference magnetic fields corresponding to a state in which the electronic circuit or circuit block is properly functioning and a state in which the electronic circuit or circuit block is not properly functioning.

According to an embodiment, the processor 708 is configured to analyze the magnetic field patterns generated by the electronic device 104 and compare them to the reference magnetic field patterns stored in the memory 710 in order to determine whether or not the various electronic circuits of the electronic device 104 are functioning properly. When an electronic circuit of the electronic device 104 is being tested, the array of magnetic sensors 706 sense the parameters of the magnetic field generated by the electronic circuits of the electronic device 104 and generate sensor signals indicating the parameters of the magnetic field. The processor 708 receive the sensor signals and generates from the sensor signals a magnetic field pattern that represents the magnetic field generated by the electronic device 104. The processor 708 then compares the magnetic field pattern to one or more of the reference magnetic field patterns stored in the memory 710 in order to determine the operability of the electronic circuit of the electronic device 104. The processor 708 is able to determine if the electronic circuit is functioning properly based on how the magnetic field pattern compares to one or more of the reference magnetic field patterns associated with the particular electronic circuit of the electronic device 104. The processor 708 can generate output data that indicates the operability of the particular electronic circuit of the electronic device 104 that is currently being tested.

According to an embodiment, the electronic circuit triage system 102 utilizes the user interface 712 in order to provide an indication of whether the electronic circuit that is currently being tested is functioning properly. The user interface 712 can provide this indication to a user of the electronic circuit triage system 102, a technician operating the electronic circuit triage system 102, or to a separate system. The user interface 712 can include a display such as an LCD screen that can display text or images indicating results of the current test. The user interface 712 can include one or more LEDs that can provide an indication of the results of the current test, the current state of operation of the electronic circuit triage system 102, or other information. The user interface 712 can include one or more speakers that can output audio information related to the state of the electronic circuit triage system 102. The user interface 712 can include one or more wireless transmitters configured to output a wireless signal carrying information to another electronic device 104 regarding operations being performed by the electronic circuit triage system 102. The user interface 712 can include one or more ports for making wired connections with other electronic devices 104. The electronic circuit triage system 102 can transmit data over the wired connections related to the operations being performed by the electronic circuit triage system 102. The electronic circuit triage system 102 can include other types of user interfaces 712 for outputting data and information to personnel or systems.

According to an embodiment, the user interface 712 can include an interface for receiving input from users, technicians, or other electronic systems. The user interface 712 can include touchscreens, touchpads, number pads, keypads, buttons, switches, or other devices by which users can input data and instructions to the electronic circuit triage system 102. The instructions can include selecting a particular model of electronic device 104 for testing. The instructions can include selecting a particular electronic circuit or circuit block of the electronic device 104 for testing.

According to an embodiment, the processor 708 controls the functionality of the various components of the electronic circuit triage system 102. The processor 708 can be connected to the user interface 712 and can receive instructions, data, or commands via the user interface 712. In response to the instructions, the data, or the commands received from the user interface 712, the processor 708 can activate the array of magnetic sensors 706 in order to sense the magnetic field from the electronic device 104 in accordance with performing triage on the electronic device 104. The processor 708 can control the memory 710 in order to retrieve the one or more reference magnetic field patterns from the memory 710. The processor 708 can generate a magnetic field pattern from sensor signals received from the array of magnetic sensors 706. The processor 708 can compare the magnetic field pattern to the one or more reference magnetic field patterns retrieved from the memory 710. The processor 708 can cause the user interface 712 to output the results so other users, technicians, or electronic systems can be aware of the results of the analysis of the electronic device 104.

According to an embodiment, the user interface 712 includes a display that displays the magnetic field patterns generated by the processor 708. A user or a technician can view the magnetic field patterns and can determine whether various circuits of the electronic device 104 are functioning properly. According to an embodiment, the display may show both the magnetic field pattern generated from a current test of an electronic circuit and a reference magnetic field pattern that indicates how the magnetic field for that electronic circuit is expected to be. The technician can then analyze the displayed magnetic field pattern images and determine whether or not the electronic circuit is functioning properly.

Those of skill in the art will recognize, in light of the present disclosure, that the electronic circuit triage system 102 can include components, functional blocks, and hardware, functional blocks in hardware other than those shown in FIG. 1 and described herein. For example, some of these components may not be discrete components, but may instead be combined together or may be part of other components. Some components may include additional hardware or functionality. Some components may perform functions ascribed to other components in the description herein. All such other components and configurations of components fall within the scope of the present disclosure.

According to an embodiment, the array of magnetic sensors 706 generates sensor signals that provide an indication of the various components of the magnetic field at various locations. For example, the array of magnetic sensors 706 can generate sensor signals that indicate the strength of the magnetic field at various locations in one or more of three dimensions. These dimensions can correspond to mutually orthogonal X, Y, and Z axes. According to an embodiment, some or all of the array of magnetic sensors 706 can move during a testing operation in order to measure the various components of the magnetic field generated by the electronic device 104 at various locations. According to an embodiment, the array of magnetic sensors 706 includes multiple magnetic sensors 706 for each component of the magnetic field. For example, the electronic circuit triage system 102 can include multiple magnetic sensors 706 for sensing an X component of the magnetic field at various locations, multiple magnetic sensors 706 for sensing a Y component of the magnetic field at various locations, and multiple magnetic sensors 706 for sensing a Z component of the magnetic field at various locations. According to an embodiment, an individual magnetic sensor 706 can sense multiple components of the magnetic field generated by the electronic device 104. According to an embodiment, the outputs of various magnetic sensors 706 together indicate the various components of the magnetic field generated by the electronic device 104. According to an embodiment, the electronic circuit triage system 102 is configured to move the electronic device 104 relative to the magnetic sensors 706 in order to sense the magnetic field at various locations.

According to an embodiment, the processor 708 generates, from the sensor signals provided by the magnetic sensors 706, a magnetic field pattern. The magnetic field patterns can correspond to a 3-D image. The processor 708 can utilize 3-D image analysis to compare the magnetic field pattern to one or more reference magnetic field patterns in order to determine whether the electronic circuit of the electronic device 104 is functioning properly.

Figure 8:
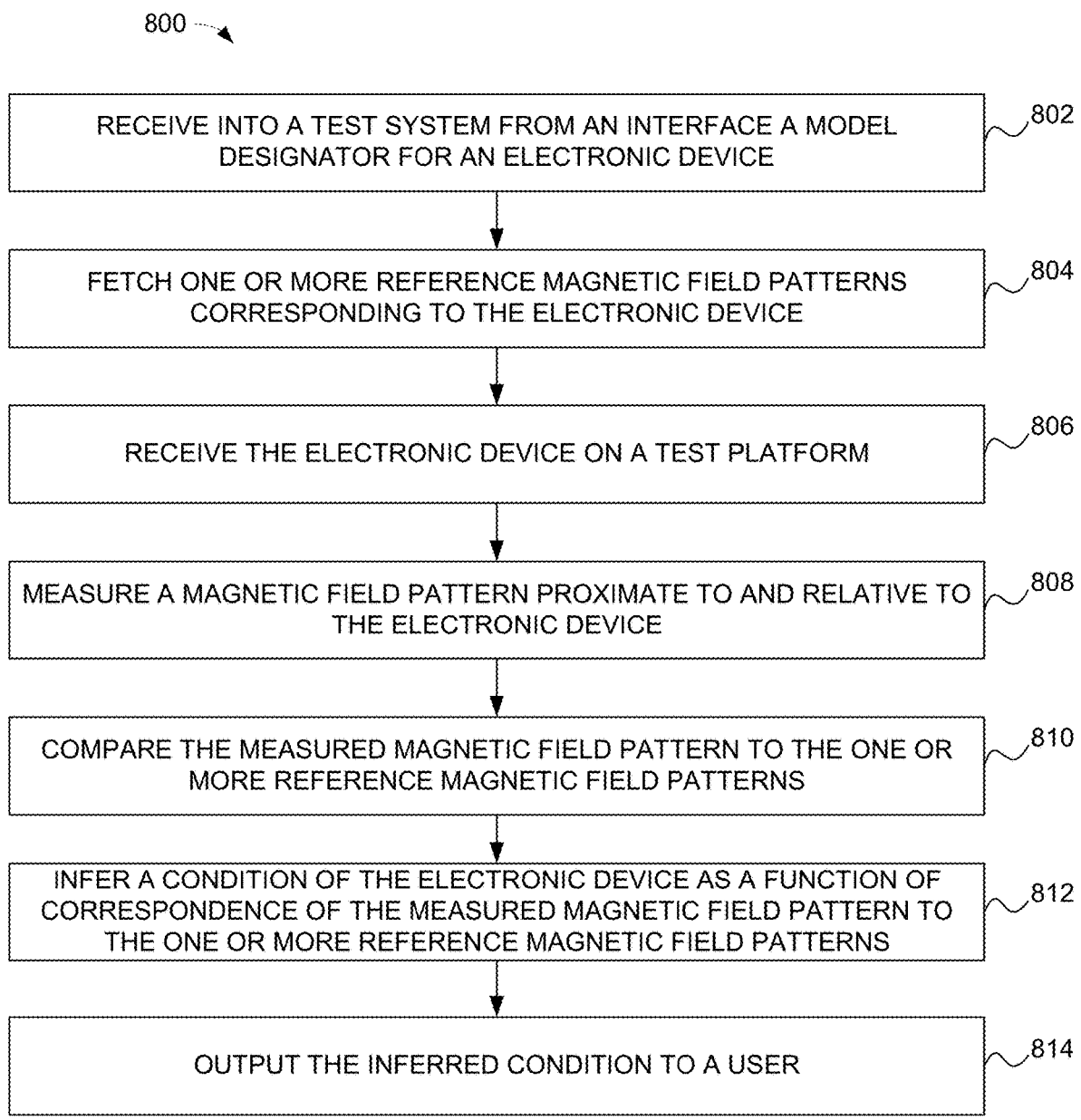
FIG. 8 is a flow diagram of a method for performing triage on an electronic device, according to an embodiment.

FIG. 8 is a flow diagram of a method 800 for performing triage on an electronic device, according to an embodiment. At 802, a model designator is received into a test system from an interface for an electronic device. At 804, one or more reference magnetic field patterns are fetched corresponding to the electronic device. At 806, the electronic device is received on a test platform. At 808, a magnetic field pattern is measured proximate to and relative to the electronic device. At 810, the measured magnetic field pattern is compared to the one or more reference magnetic field patterns. At 812, a condition of the electronic device is inferred as a function of correspondence of the measured magnetic field pattern to the one or more reference magnetic field patterns. At 814, the inferred condition is output to the user.

According to an embodiment, the one or more reference magnetic field patterns includes a plurality of reference magnetic field patterns.

According to an embodiment, each reference magnetic field pattern corresponds to a nominal condition, a condition requiring repair, a condition corresponding to disablement of an electronic device subsystem, a condition requiring battery charging, or a condition indicating battery degradation.

According to an embodiment, the method can further include capturing an image of the electronic device and determining an orientation and location of the electronic device relative to the test platform. Comparing the measured magnetic field pattern to the one or more reference magnetic field patterns can compensate for the orientation and location of the electronic device relative to the test platform.

According to an embodiment, the method further includes transmitting a signal to the electronic device to attempt to cause the electronic device to enter one or more activated states. According to an embodiment, measuring the magnetic field pattern proximate to and relative to the electronic device includes measuring the magnetic field pattern while the electronic device is in each of the one or more activated states.

Figure 9:
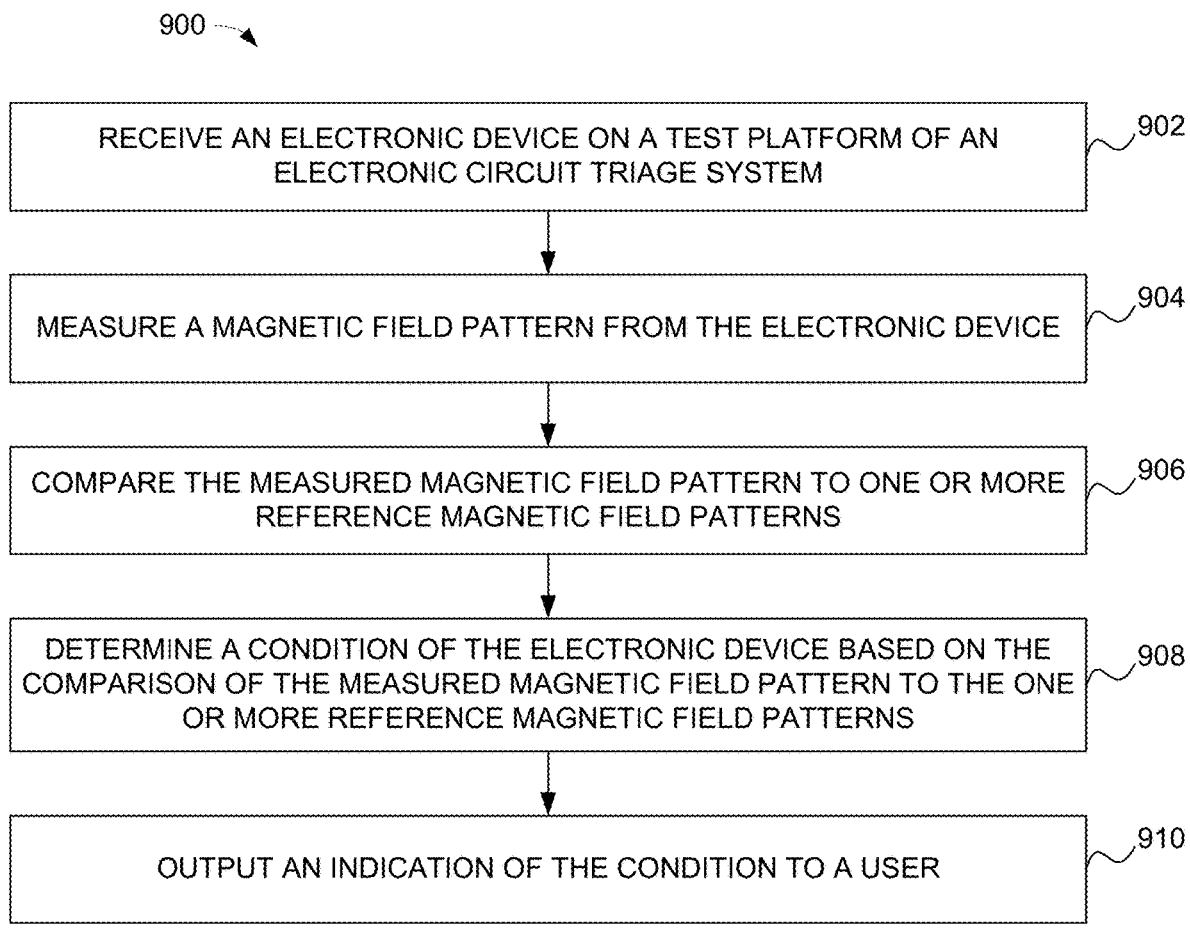
FIG. 9 is a flow diagram of a method, according to an embodiment.

FIG. 9 is a flow diagram of a method 900, according to an embodiment. The method 900 includes, in step 902, receiving an electronic device on a test platform of an electronic circuit triage system. In step 904, the method 900 includes measuring a magnetic field pattern from the electronic device. In step 906, the method 900 includes comparing the measured magnetic field pattern to one or more reference magnetic field patterns. In step 908, the method 900 includes determining a condition of the electronic device based on the comparison of the measured magnetic field pattern to the one or more reference magnetic field patterns. In step 910, the method 900 includes outputting an indication of the condition to a user.

According to an embodiment, the method 900 further includes receiving, into the electronic circuit triage system, a model designation for the electronic device, and fetching the one or more reference magnetic field patterns in accordance with the model designation. In one embodiment, the model designation identifies a make or model of the electronic device. The electronic device may be a mobile phone. In another embodiment, the one or more reference magnetic field patterns include a plurality of reference magnetic field patterns.

According to an embodiment, each reference magnetic field pattern corresponds to a nominal condition, a condition requiring repair, a condition corresponding to disablement of an electronic device subsystem, a condition requiring battery charging, or a condition indicating battery degradation.

According to an embodiment, the method 900 further includes capturing one or more reference images of the electronic device, and determining an orientation and a location of the electronic device relative to the test platform. Comparing the measured magnetic field pattern to the one or more reference magnetic field patterns can include compensating for the orientation and the location of the electronic device relative to the test platform.

According to an embodiment, the method 900 further includes transmitting a signal to the electronic device to attempt to cause the electronic device to enter one or more activated states. Measuring the magnetic field pattern from the electronic device can include measuring the magnetic field pattern while the electronic device is in each of the one or more activated states.

According to an embodiment, the method 900 further includes receiving a selection of a component of the electronic device for testing, wherein the one or more reference images correspond to the selected component. In one embodiment, the selected component includes one or more of: a battery of the electronic device, a battery charging circuit of the electronic device, a memory of the electronic device, a display of the electronic device, and a power management system of the electronic device.

According to an embodiment, outputting the indication of the condition to the user includes displaying the indication on the display of the electronic circuit triage system.

According to an embodiment, an electronic circuit triage system includes a test platform configured to receive an electronic device, and one or more arrays of magnetic sensors collectively positioned and configured to sense magnetic field characteristics indicative of a magnetic field pattern from the electronic device when the electronic device is positioned on the test platform. The electronic circuit triage system also includes a microprocessor coupled to the magnetic sensor and configured to compare the magnetic field pattern to one or more reference magnetic field patterns and to diagnose a condition of the electronic device based on a comparison of the magnetic field pattern to the one or more reference magnetic field patterns.

According to an embodiment, the electronic circuit triage system further includes a memory configured to store the one or more reference magnetic field patterns. The microprocessor may be configured to access the one or more reference magnetic field patterns from the memory.

According to an embodiment, the electronic circuit triage system further includes a user interface configured to receive a model designation indicating a model of the electronic device and to output a condition of the electronic device to a user.

According to an embodiment, the microprocessor selects the one or more reference magnetic field patterns based on the model designation.

According to an embodiment, the user interface receives a selection of a component of the electronic device. In one embodiment, the one or more reference magnetic field patterns are selected by the microprocessor based on the selected component and the model designation.

According to an embodiment, the microprocessor is configured to execute computer instructions to interrogate and receive signals indicative of the magnetic field pattern from the magnetic sensors. Additionally or alternatively, the microprocessor is configured to generate the magnetic field pattern based on indications of magnetic field strengths and directions from the one or more arrays of magnetic sensors, diagnose the condition of the electronic device by inferring the condition of the electronic device by selecting a best fit between the magnetic field pattern and the one or more reference magnetic field patterns, and output the inferred condition to the user via the user interface.

Figure 10:
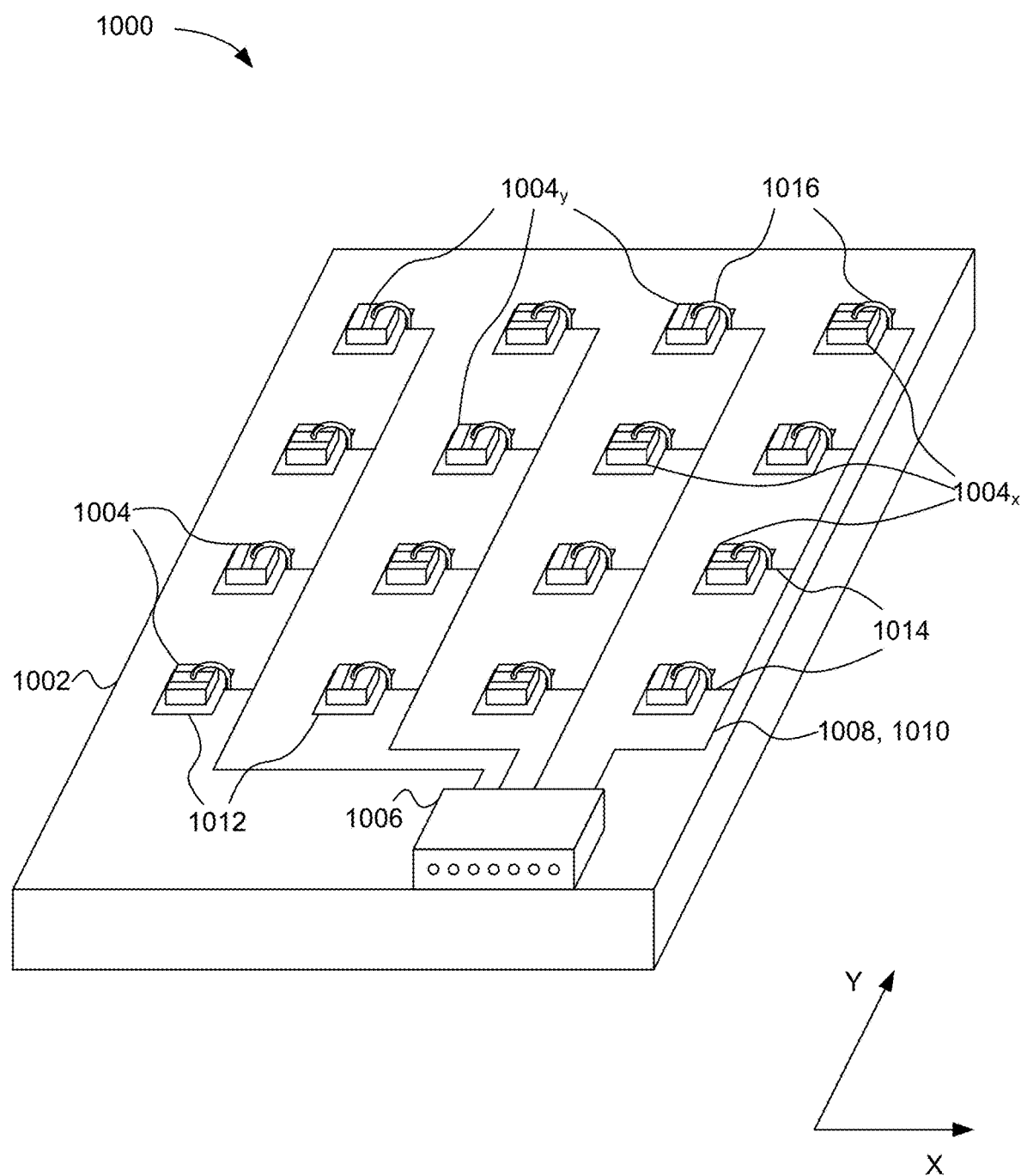
FIG. 10 is a view of a magnetic sensor array, according to an embodiment.

FIG. 10 is a view of a magnetic sensor array 1000, according to an embodiment. The magnetic sensor array 1000 includes a substrate 1002. A plurality of magnetic sensors 1004 and a sensor array interface 1006 are disposed on the substrate 1002. A sensor interface circuit 1008 is disposed on the substrate 1002 and configured to operatively couple the plurality of magnetic sensors 1004 to the sensor array interface 1006.

According to an embodiment, a first portion 1004x of the plurality of magnetic sensors 1004 can be arranged to detect local magnetic fields along an x-axis parallel to the substrate 1002 and a second portion 1004y of the plurality of magnetic sensors 1004 can be arranged to detect local magnetic fields along a y-axis parallel to the substrate 1002 perpendicular to the x-axis. Additionally or alternatively, the first and second portions 1004x, 1004y of the plurality of magnetic sensors 1004 can be arranged in an alternating array on the substrate 1002.

In another embodiment, the plurality of magnetic sensors 1004 can include z-axis sensors aligned to directly detect a z-axis local magnetic field (aligned normal to the substrate 1002). In some embodiments, it may be useful for all of the plurality of sensors 1004 to be z-axis magnetic sensors. In other embodiments, the inventors contemplate a mixture of x-axis, y-axis, and z-axis sensors to be disposed on the substrate 1002. The arrays of x-axis, y-axis, and z-axis magnetic sensors can be disposed in a pattern. In some embodiments, z-axis magnetic field data can provide enhanced spatial resolution compared to x-axis and y-axis magnetic field data. The sensors 1004 can be arranged in a XZYZ pattern (to be read clockwise, akin to a Bayer filter).

The sensor interface circuit 108 can include conductive traces 1010 disposed on the substrate 1002. A plurality of mounting pads 1012 can be disposed on the substrate 1002 and operatively coupled to the conductive traces 1010 and respective ones of the plurality of magnetic sensors 1004. A plurality of bonding pads 1014 can be operatively coupled to the conductive traces 1010 and disposed on the substrate 1002. A wire bond 1016 can respectively couple each bonding pad 1014 to a corresponding magnetic sensor 1004. The conductive traces 1010 can include metal traces.

Figure 11:
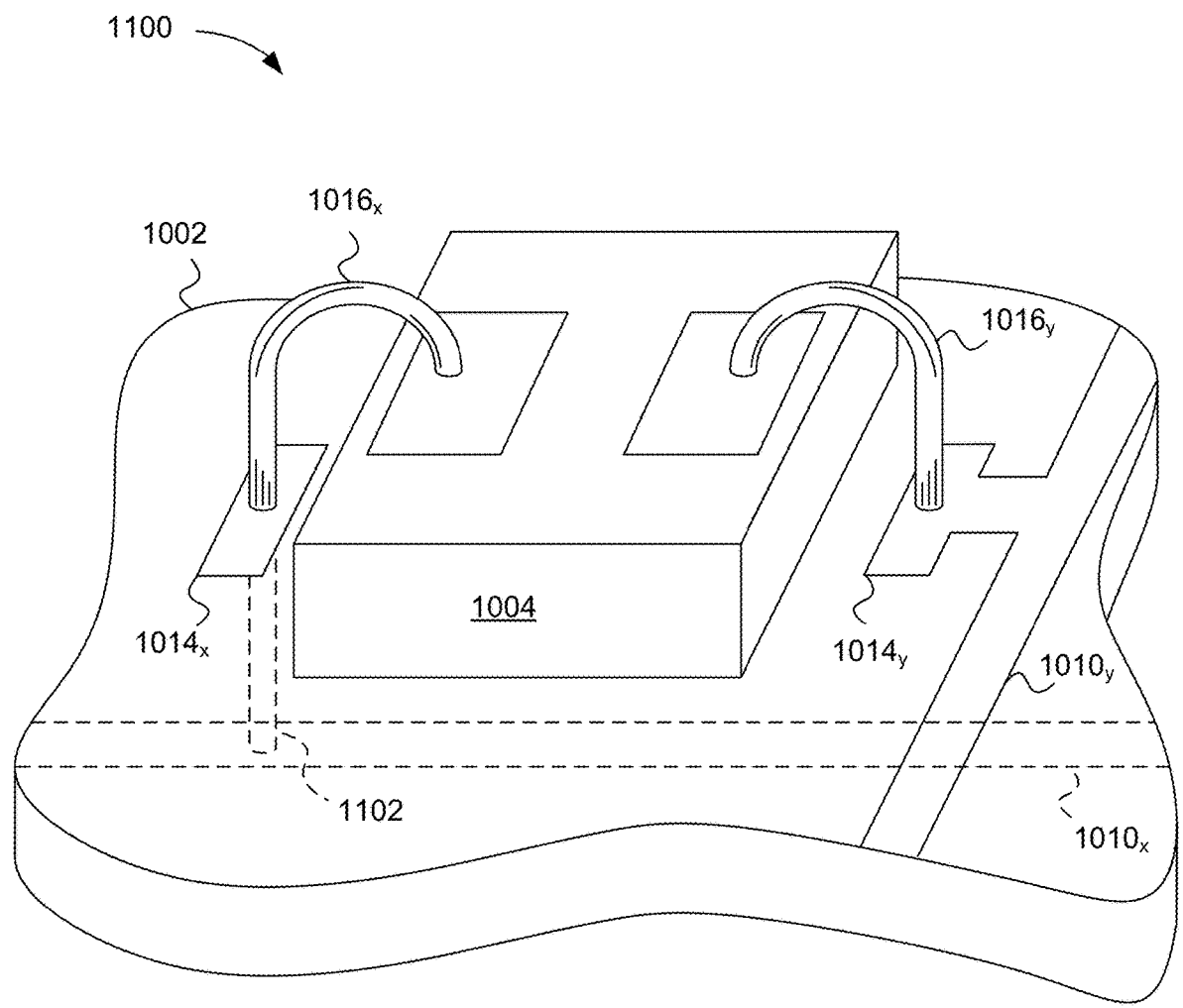
FIG. 11 is a partial view of a magnetic sensor array, according to an embodiment.

FIG. 11 is a partial view of a magnetic sensor array 1100, according to an embodiment. The sensor interface circuit 1008 can include respective row and column conductive traces 1010x, 1010y disposed on the substrate 1002. Respective bonding pads 1014x, 1014y can be disposed on the substrate 1002 and operatively coupled to the conductive traces 1010x, 1010y, optionally through vias 1102. Wire bonds 1016x, 1016y can couple the bonding pads 1014x, 1014y to each magnetic sensor 1004.

Figure 12:
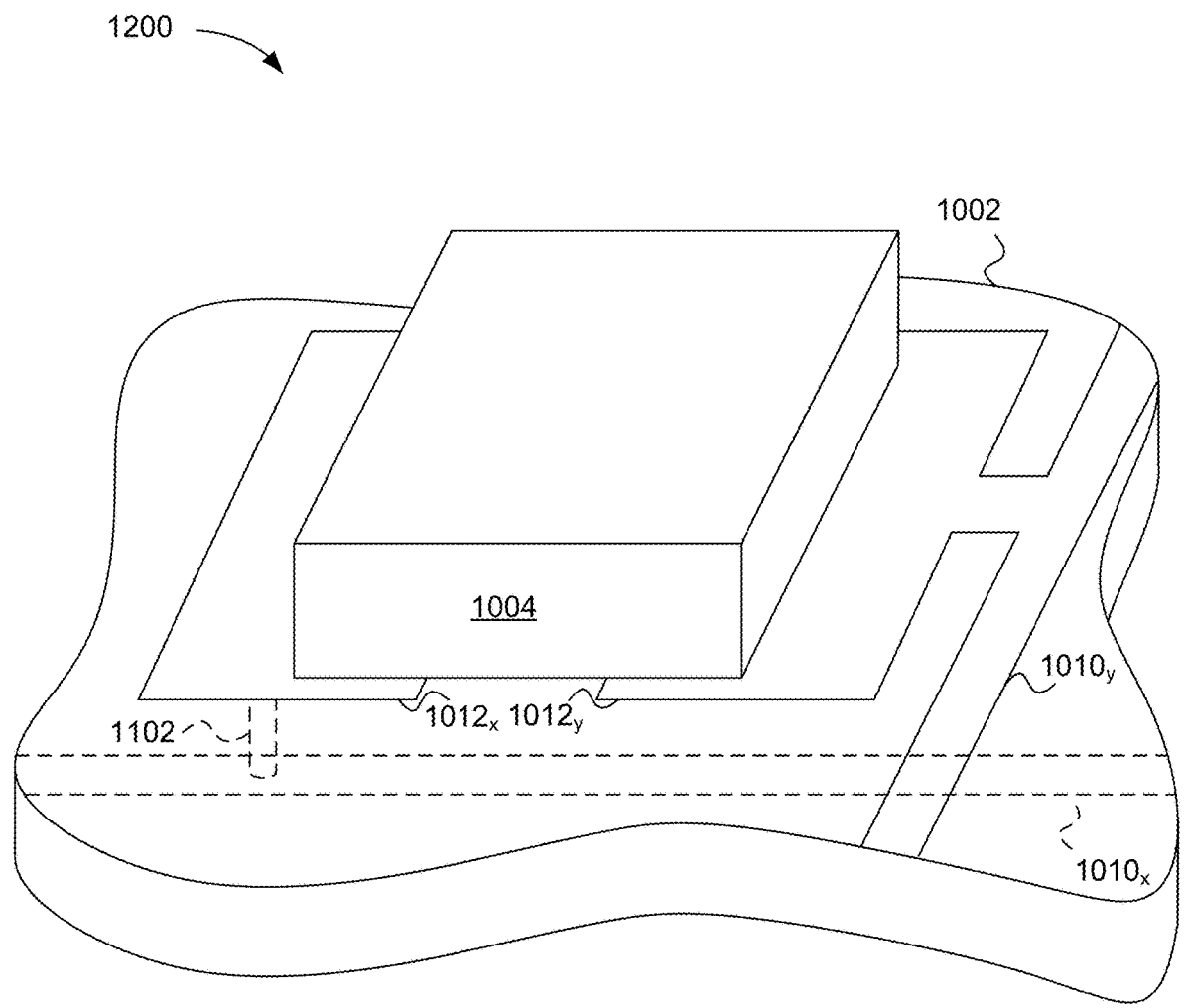
FIG. 12 is a partial view of a magnetic sensor array, according to an embodiment.

FIG. 12 is a partial view of a magnetic sensor array 1200, according to another embodiment. The sensor interface circuit 1008 can include conductive traces 1010x, 1010y disposed on the substrate 1002. A plurality of pairs of mounting pads 1012x, 1012y can be disposed on the substrate 1002 and operatively coupled to the conductive traces 1010x, 1010y. Each of the magnetic sensors 1004 can be coupled to a respective pair of mounting pads 1012x, 1012y.

In an alternative embodiment, areal density of the magnetic sensors 1004 can be increased by the use of buried traces 1010x, 1010y. The buried traces 1010x, 1010y can be coupled to the mounting pads 1012x, 1012y through vias 1102 formed between selected conductive traces 1010x, 1010y and the mounting pads 1012x, 1012y.

Figure 13:
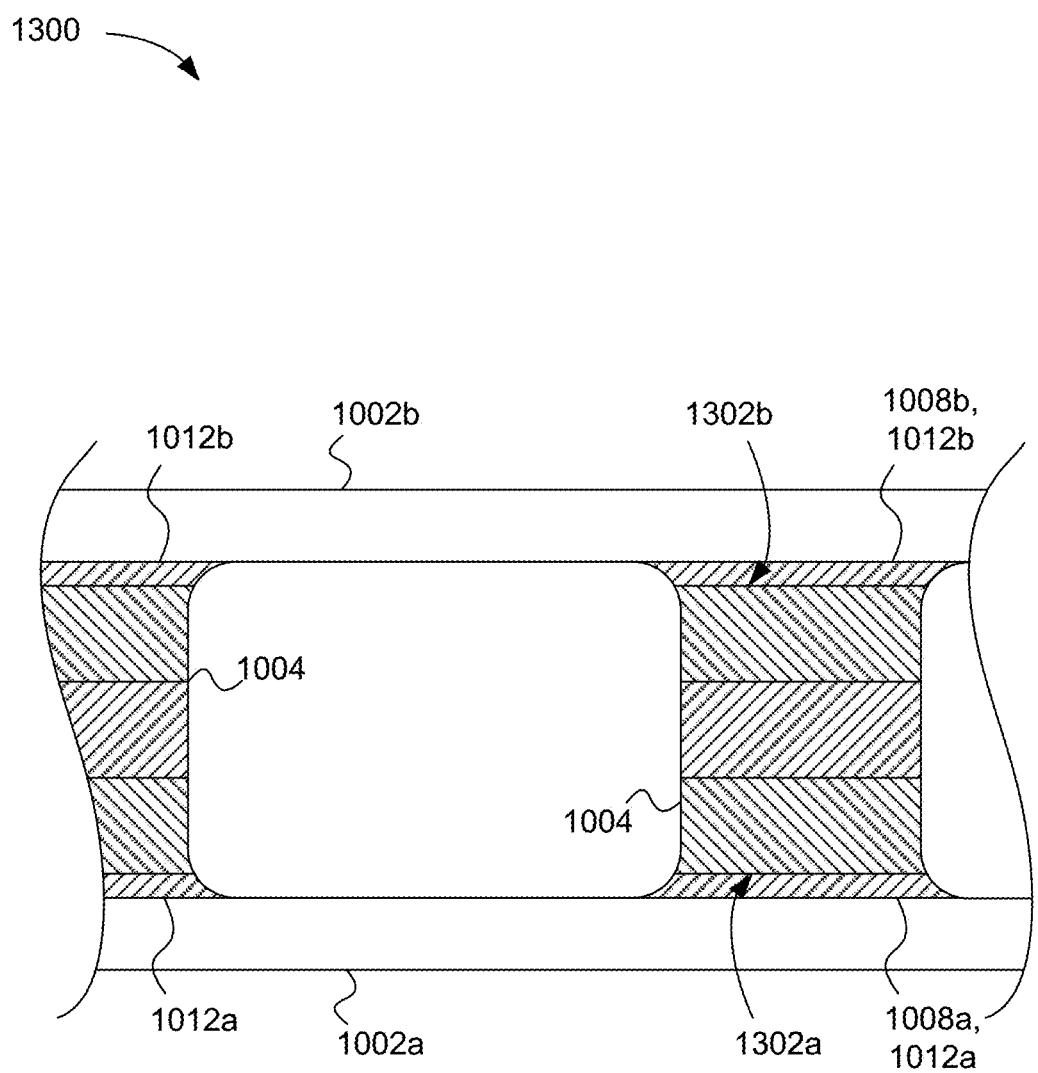
FIG. 13 is a sectional view of a magnetic sensor array, according to an embodiment.

FIG. 13 is a sectional view of a magnetic sensor array 1300, according to another embodiment. The substrate 1002 can include two substrates 1002a, 1002b. The sensor interface circuit 1008 can include two sensor interface circuits 1008a, 1008b respectively disposed on each of the two substrates 1002a, 1002b. Each of the two sensor interface circuits 1008a, 1008b can include conductive traces disposed on each respective substrate 1002a, 1002b. A plurality of mounting pads 1012a, 1012b can be disposed on the respective substrate 1002a, 1002b and operatively coupled to the conductive traces. Each sensor 1004 can include a bottom surface 1302a operatively coupled to a respective one of the plurality of mounting pads 1012a disposed on the first substrate 1002a. Each sensor 1004 can include a top surface 1302b opposite of the bottom surface 1302a and in contact with a respective one of the plurality of mounting pads 1012b disposed on the second substrate 1002b.

Figure 14:
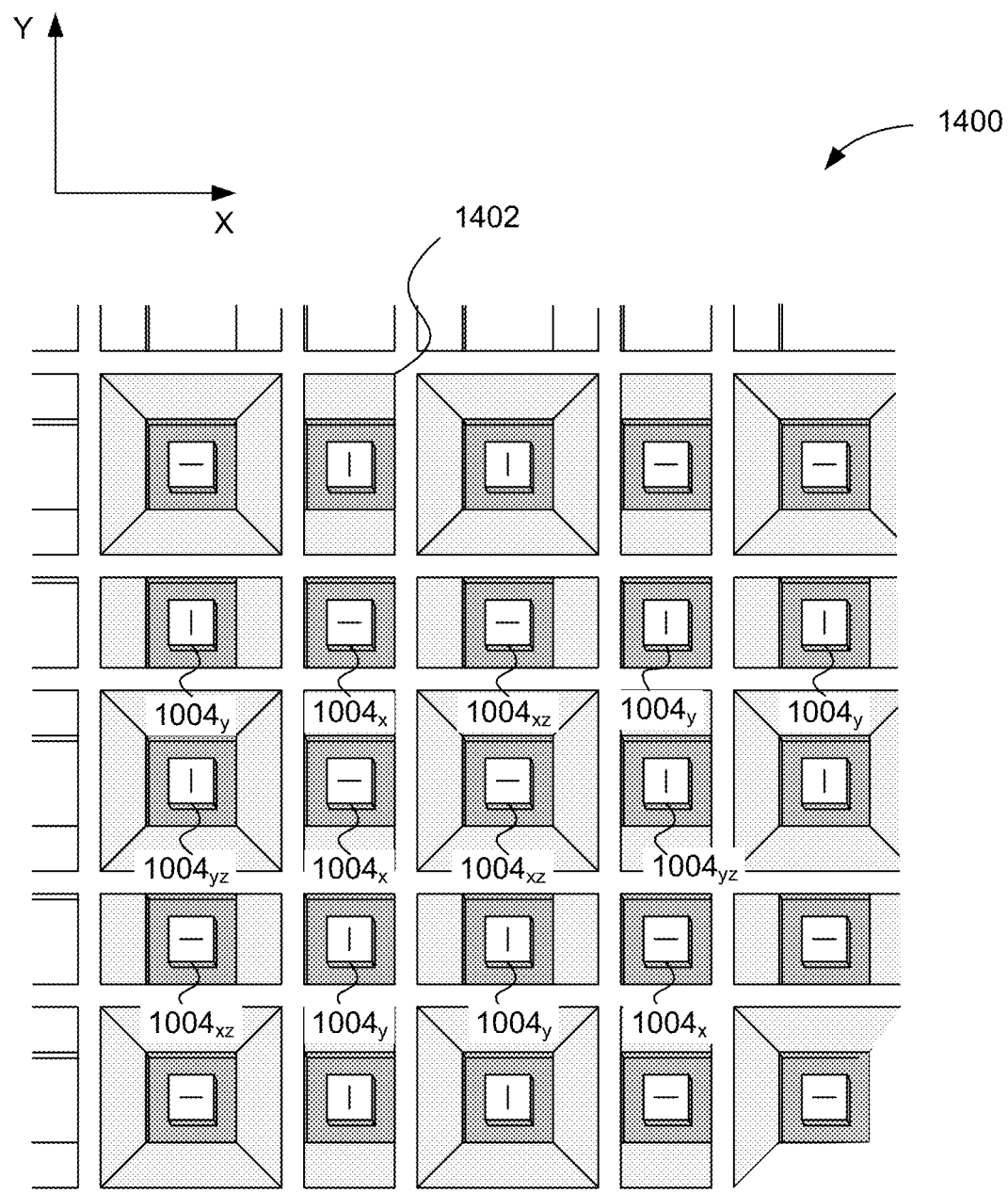
FIG. 14 is a partial top view of a magnetic sensor array, according to an embodiment.
Figure 15:
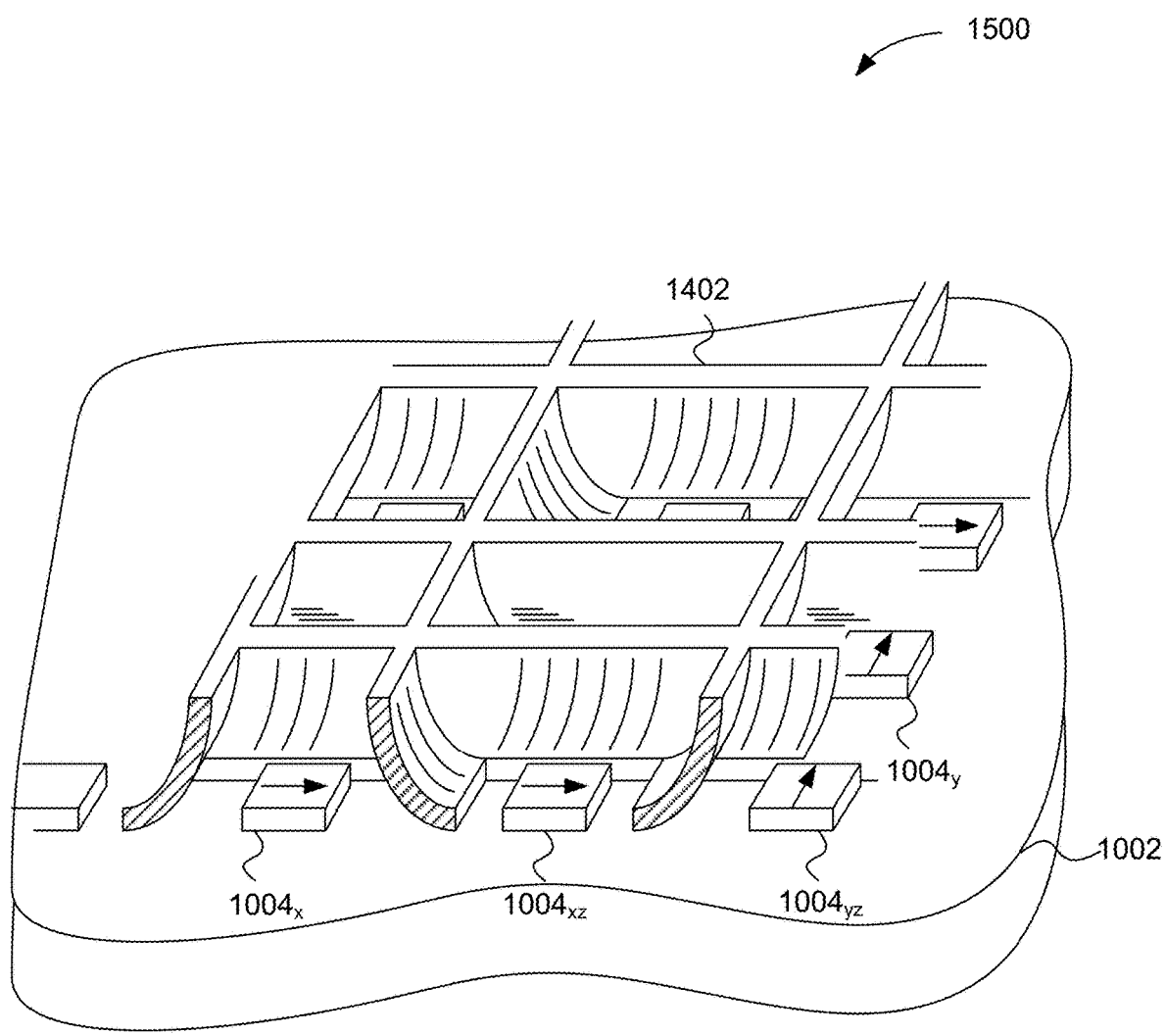
FIG. 15 is a perspective view of a portion of the magnetic sensor array of FIG. 14, according to an embodiment.
Figure 16:
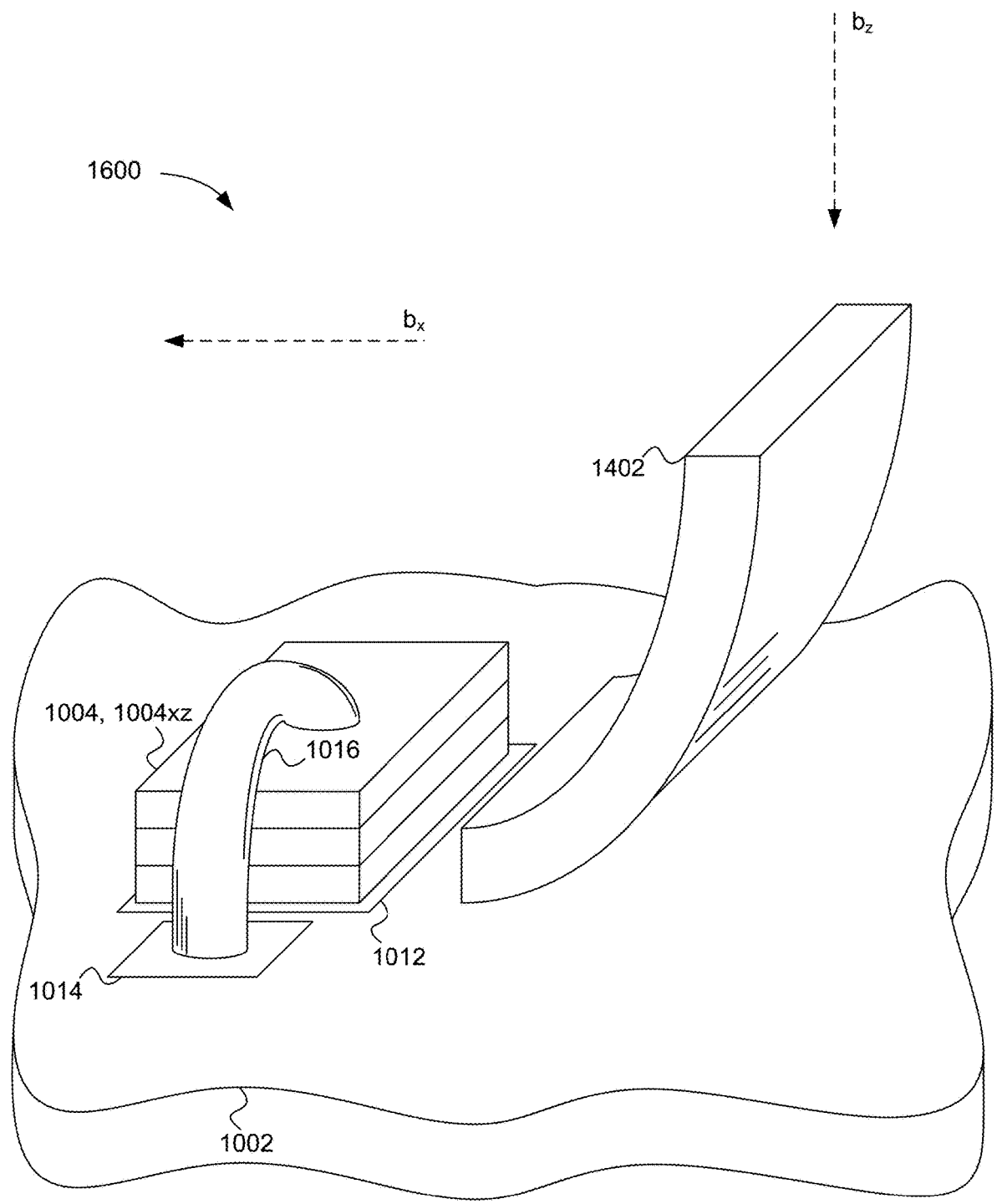
FIG. 16 is a detail view of an illustrative sensor in the magnetic sensor array of FIG. 14 and a portion of a magnetic field converter configured to guide a magnetic field component received normal to a substrate surface to an axis parallel to the substrate surface, according to an embodiment.

FIG. 14 is a partial top view of a magnetic sensor array 1400, according to an embodiment. FIG. 15 is a perspective view 1500 of a portion of the magnetic sensor array 500 of FIG. 14, according to an embodiment. FIG. 16 is a detail view 1600 of the magnetic sensor array 1400 of FIG. 14, according to an embodiment.

Referring to FIGS. 14-16, a first portion 1004x of the plurality of magnetic sensors 1004 can be arranged to detect local magnetic fields along an x-axis parallel to the substrate 1002. A second portion 1004y of the plurality of magnetic sensors 1004 can be arranged to detect local magnetic fields along a y-axis parallel to the substrate 1002 perpendicular to the x-axis. A third portion 1004xz of the plurality of magnetic sensors 1004 can be arranged to detect a combination of local magnetic fields along the x-axis parallel to the substrate 1002 and local magnetic fields along a z-axis perpendicular to the substrate 1002. A fourth portion 1004yz of the plurality of magnetic sensors 1004 can be arranged to detect a combination of local magnetic fields along the y-axis parallel to the substrate 1002 perpendicular to the x-axis and local magnetic fields along a z-axis perpendicular to the substrate 1002.

Referring to FIGS. 14-16, the magnetic sensor array 1400, 1500, 1600 can further include a magnetic field converter 1402 disposed proximate to the plurality of sensors 1004. The magnetic field converter 1402 can include high magnetic permeability and low coercivity metal configured to convert at least a portion of a z-axis magnetic field component to a converted magnetic field component in an x,y plane.

The magnetic field converter 1402 can be formed from mu-metal, a stamped and punched high permeability metal sheet, a stamped metal screen, and/or formed by plating a surface of a dielectric substrate. The magnetic field converter 1402 can include a curved shape selected to convey the z-axis magnetic field component into the x,y plane along the high reluctance magnetic path defined by the high magnetic permeability material.

The converted magnetic field component in the x,y plane can include at least of a portion of a magnetic field component aligned through at least a portion of the magnetic sensors 1004. The portion of the magnetic sensors 1004 aligned to the magnetic field component in the x,y plane can include at least one magnetic sensor 1004.

The portion of the magnetic field sensors 1004 aligned to the magnetic field component in the x,y plane can include a portion of the magnetic field sensors 1004 corresponding to a magnetic field return loop distance. The magnetic field return loop distance can correspond to a displacement between magnetic poles of a sensed magnetic object. The magnetic field return loop distance can correspond to a completed magnetic circuit between opposite magnetic poles comprising a magnetically sensed object. Additionally or alternatively, the magnetic field converter 1402 may include a (concave downward) transmission loop shaped to convey a magnetic field from a (concave upward) portion of the magnetic field converter 1402, through the x,y plane magnetic sensor 1004, toward a more distal point, such that the received magnetic field is transmitted along a low reluctance path, discontinuous across the magnetic sensor 1004, toward a more distal region but shunted sideways between opposing tips of the magnetic field converter 1402.

Figure 17:
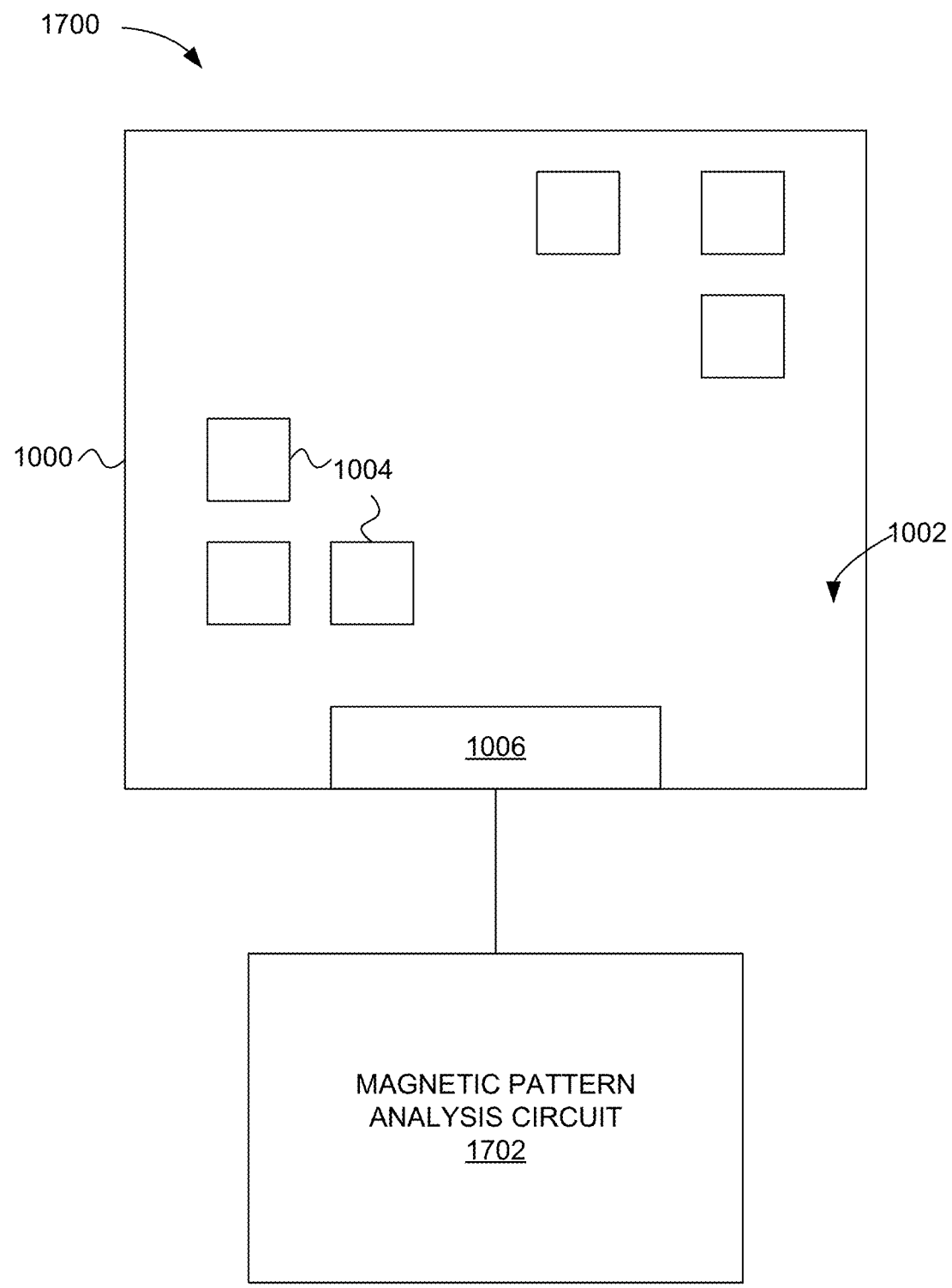
FIG. 17 is a block diagram of a magnetic sensing system, according to an embodiment.

FIG. 17 is a block diagram of a magnetic sensor system 1700, according to an embodiment. A magnetic sensor array 1000 can operatively couple to a magnetic pattern analysis circuit 1702 via the sensor interface circuit 1008 and the sensor array interface 1006. The magnetic pattern analysis circuit 1702 can be configured to correlate a distance between sensors 1004 in the array to a physical distance between poles of a sensed magnetic object.

Various sensor array sizes are contemplated and/or have been tested by the inventors. According to embodiments, the plurality of magnetic sensors 1004 are disposed in an array of at least two sensors by two sensors. For example, the plurality of magnetic sensors 1004 can include an array of at least eight sensors by eight sensors. In another embodiment, more or fewer magnetic sensors 1004 can be combined on a substrate.

Various types of magnetic field sensors are contemplated and/or have been tested by the inventors. In an embodiment, the plurality of magnetic sensors 1004 can include a plurality of bare-dies. In another embodiment, the plurality of magnetic sensors 1004 can include a plurality of sensors formed directly on the substrate 1002. Various magnetic sensing technologies can be used by the magnetic sensors 1004. For example, the magnetic sensors 1004 can include spintronic sensors, inductive sensors, and/or coil-type sensors. Generally, sensors 1004 described herein are magnetometers.

For purposes of example, a spintronic sensor can include a first high coercivity layer magnetically poled along a first axis, a low coercivity layer disposed on the first high coercivity layer and a second high coercivity layer magnetically poled along the first axis and disposed on the low coercivity layer opposite the first high coercivity layer. The low coercivity layer is arranged to be magnetically poled by a detectable magnetic field having a second axis different than the first axis. The magnetic sensor 1004 can be configured to exhibit a variable resistance through the low coercivity layer as a function of an angle between the first and second axes.

The substrate 1002 can be a flexible substrate. A flexible substrate can be useful, for example, for conforming the magnetic sensors 1004 to a curved surface. The flexible substrate can include polyimide. Additionally or alternatively, the substrate 1002 can include a non-flexible substrate. The non-flexible substrate can include a fiberglass-epoxy substrate. For example, a fiberglass-epoxy substrate can be a planar substrate or can be molded to a shape conforming to an object selected for sensing. In another embodiment, the substrate 1002 can include a curved substrate.

In some embodiments, it is desirable to detect magnetic fields produced within or adjacent to a curved surface. The substrate 1002 can optionally be curved to match the curvature of the measured surface. For example, a prototype measured surface can be used as a master. A mold release compound can be applied to the prototype measured surface. Fiberglass and epoxy can be laid up over the release-treated prototype surface.

After curing, the curved substrate 1002 is removed from the prototype surface and trimmed. A sensor interface circuit 1008 (as shown in FIG. 10) can be formed by running copper (or other conductor) wires across the back of the curved substrate 1002 (the back side being the side opposite to the measured surface). Individual sensors 1004 are adhered to the back of the curved substrate 1002, for example using silicone adhesive. The wires making up the sensor interface circuit 1008 are individually soldered to the magnetic sensors 1004. Wires can also be tacked or fully adhered to the back of the curved substrate 1002 using silicone adhesive. A sensor array interface 1006 can be formed from an electrical junction block that is coupled to each of the wires.

Figure 18:
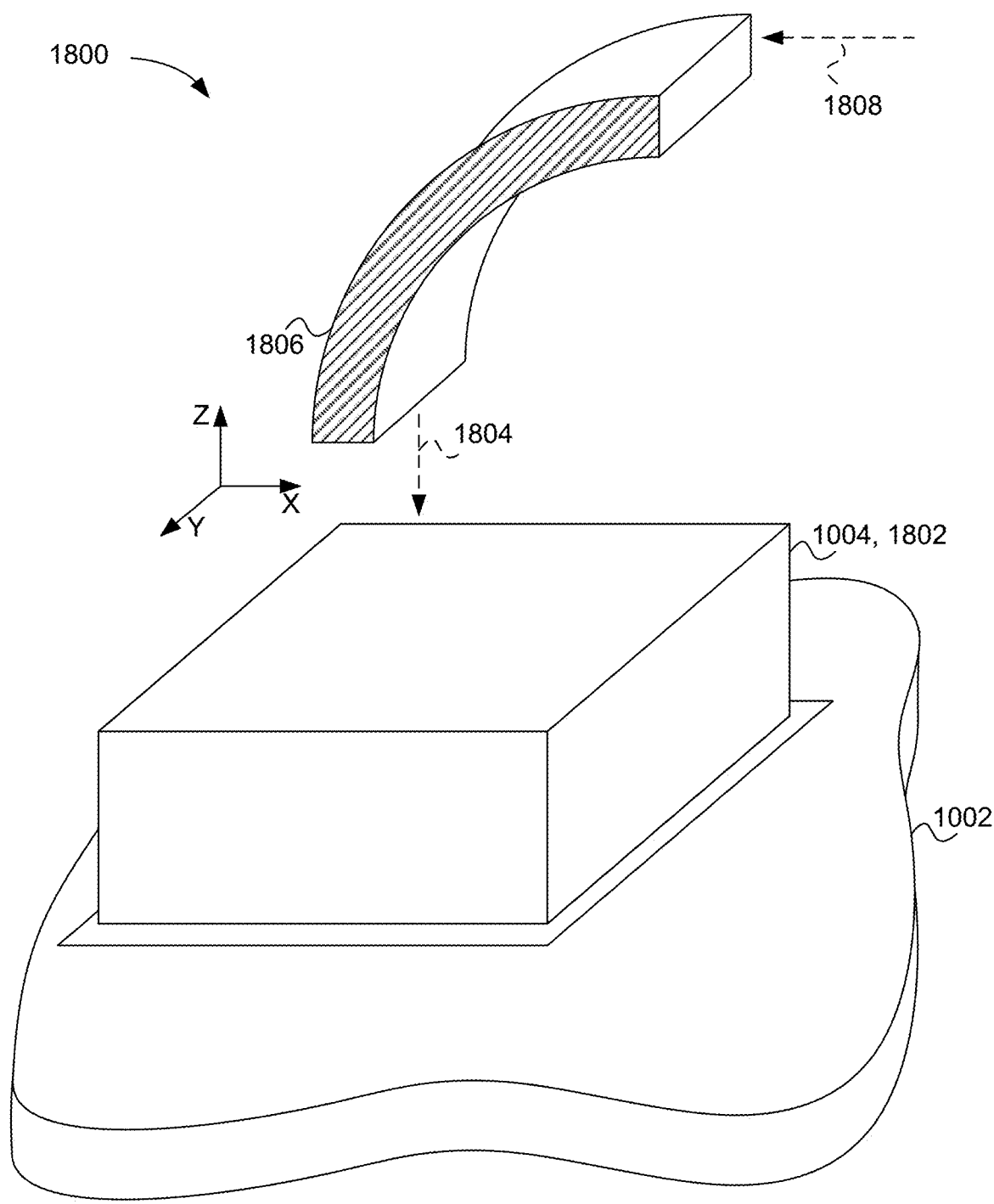
FIG. 18 is a detail view of an illustrative sensor in a magnetic sensor array and a portion of a magnetic field converter configured to guide a magnetic field component received parallel to a substrate surface to an axis normal to the substrate surface, according to an embodiment.

FIG. 18 is a partial view of the magnetic sensor array 1800, according to an embodiment. The magnetic sensor array 1800 can include at least a portion 1802 of the plurality of magnetic sensors 1004 arranged to detect local magnetic fields 1804 along a z-axis normal to the substrate 1002. Additionally or alternatively, other portions 1802 of the plurality of magnetic sensors 1004 can be arranged to respectively detect local magnetic fields along an x-axis parallel to the substrate 1002 and along a y-axis parallel to the substrate 1002 and perpendicular to the x-axis. According to an embodiment, substantially all of the magnetic sensors 1004 can be arranged to detect local magnetic fields 1804 along a z-axis normal to the substrate 1002.

The magnetic sensor array 1800 can further include a magnetic field converter 1806 disposed proximate to at least some of the portion 1802 of the plurality of sensors 1004. The magnetic field converter 1806 can include a low coercivity metal configured to convert at least a portion of an x-axis magnetic field component 1808 to a converted magnetic field component 1804 along the z-axis. The magnetic field converter 1806 can be configured to convert the x-axis magnetic field component to a local z-axis magnetic field component 1804 for detection by a portion 1802 of the magnetic sensors 1004 arranged to detect local magnetic fields 1804 along the z-axis. Additionally or alternatively, the magnetic field converter 1806 can include a low coercivity metal configured to convert at least a portion of a y-axis magnetic field component to a converted magnetic field component 1804 along the z-axis.

Figure 19:
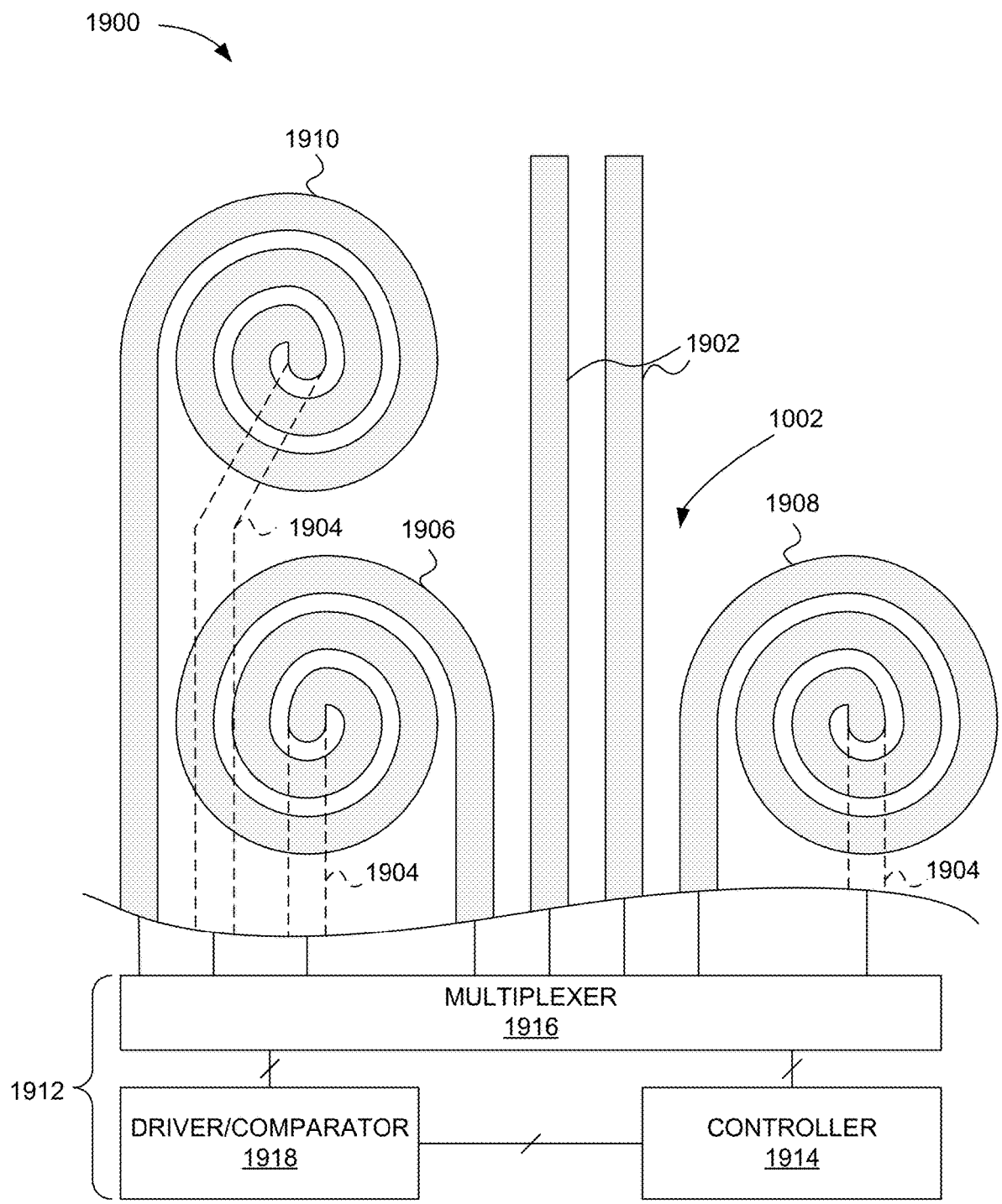
FIG. 19 is a plan (top) view of a magnetic sensor system including a plurality of z-axis magnetic field sensors formed directly on a substrate, according to an embodiment.

FIG. 19 is a plan (top) view of a magnetic sensor system 1900 including a plurality of z-axis magnetic field sensors formed directly on a substrate 1002, according to an embodiment. The magnetic pattern sensor system 1900 can include a sensor substrate 1002. A plurality of conductive traces 1902, 1904 can be formed directly on the sensor substrate 1002. A plurality of magnetic field sensors 1906, 1908, 1910 can be formed from the plurality of conductive traces 1902, 1904. A control circuit 1912 can be operatively coupled to the plurality of conductive traces 1902, 1904.

The plurality of magnetic field sensors 1906, 1908, and 1910 can be coils configured to generate current flow responsive to a local magnetic field component and to modify a current flow applied to each magnetic field sensor as a function of a local magnetic field component. The plurality of magnetic field sensors 1906, 1908, and 1910 each can be configured to detect a magnetic field component oriented normal to the sensor substrate 1002.

In an embodiment, the sensor substrate 1002 can be planar. The magnetic field sensors 1906, 1908, 1910 can be formed by screen printing a thick film conductive paste on the sensor substrate 1002. The magnetic field sensors 1906, 1908, 1910 can be formed by pad printing a thick film conductive paste on the sensor substrate 1002. The magnetic field sensors 1906, 1908, 1910 can be formed from a printed and cured conductive thick film paste. Additionally or alternatively, the magnetic field sensors 1906, 1908, 1910 can be formed by selectively etching a conductive layer carried by the sensor substrate 1002.

The sensor substrate 1002 can be rigid. In another embodiment, the sensor substrate 1002 can be flexible.

The control circuit 1912 can include a multiplexer 1916 configured to select and enable a subset of the magnetic field sensors 1906, 1908, 1910 for detecting local magnetic field components. An electronic controller 1914 can be configured to operate magnetic sensor 1906, 1908, 1910 detection logic. A driver and comparator circuit 1918 can be configured to detect an electrical signal corresponding to a magnetic field component corresponding to each magnetic sensor 1906, 1908, 1910. The control circuit 1912 can be configured to apply a drive voltage to each magnetic field sensor 1906, 1908, 1910.

The control circuit 1912 can be configured to detect an electrical response of each magnetic field sensor 1906, 1908, 1910 to the drive voltage. The control circuit 1912 can be configured to correlate the electrical response of each magnetic field sensor 1906, 1908, 1910 to a local magnetic field strength proximate to the respective magnetic field sensor 1906, 1908, 1910.

The electrical response can include a current flow that is a function of the local magnetic field strength. The electrical response can include a time between application of the drive voltage and receipt of a current flow respectively to and from each magnetic field sensor 1006, 1008, 1010. Additionally and/or alternatively, the electrical response can include a comparison of voltage between adjacent magnetic field sensors 1906, 1908, 1910 that are coiled in opposite directions.

In an embodiment, the drive voltage can be bipolar. The electrical response can include a response time for rising and falling edges of a drive waveform that is a function of a local magnetic field component.

According to an embodiment, the control circuit 1912 can be configured to detect a voltage difference generated by pairs of magnetic field sensors 1906 and 1908, and 1906 and 1910 that are coiled in opposite directions.

In another embodiment, the magnetic field sensors 1906, 1908, 1910 can be coiled in the same direction (e.g., all right-hand or all left-hand). One or more sensors can be driven by the driver-comparator circuit 1918 to output a known magnetic field component. One or more different sensors can receive an induced current flow responsive to the known magnetic field component plus an unknown component. The one or more driven sensors can then be stopped being driven to output the known magnetic field component. The one or more different sensors can receive an induced current flow attributable to only the unknown component. Timing of differences in current flow in the non-driven sensor can be used to determine a value for the unknown magnetic field component.

Additional or alternative sensing modalities can similarly be used by the control circuit 1912 to determine unknown magnetic field components across the array of magnetic field sensors 1906, 1908, 1910.

Figure 20:
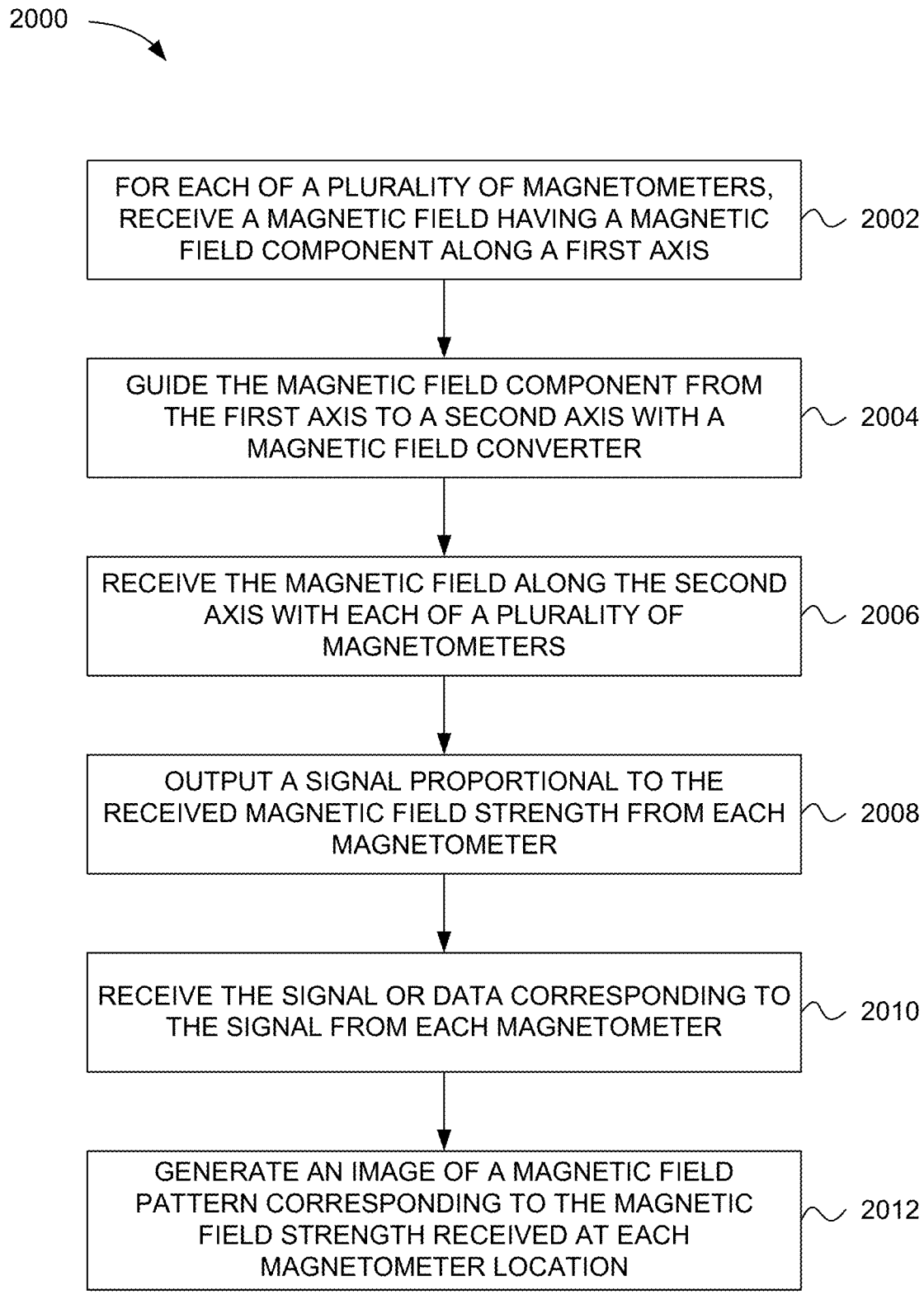
FIG. 20 is a flow chart showing a method for operating a magnetic sensor array, according to an embodiment.

FIG. 20 is a flow chart showing a method 2000 for operating a magnetic sensor array, according to an embodiment. The method 2000 includes step 2002 wherein, for each of a plurality of magnetometers in a magnetic sensor array, receiving a magnetic field having a magnetic field component along a first axis. In step 2004, the magnetic field component is guided with a magnetic field converter from the first axis to a second axis. Proceeding to step 2006, the magnetic field is received along the second axis with the magnetometer.

As shown in step 2008, a signal or data proportional to the received magnetic field strength along the second axis is output from the magnetometer through a sensor interface circuit to a sensor array interface. The method 2000 can further include step 2010, wherein the plurality of data or signals corresponding to the plurality of magnetometers is received from the sensor array interface into a magnetic pattern analysis circuit. As shown in step 2012, an image of a magnetic field pattern corresponding to the received magnetic field at each of a plurality of magnetometer locations in the magnetic sensor array is generated by the magnetic pattern analysis circuit.

Referring to step 2004, guiding the magnetic field component with the magnetic field converter from the first axis to the second axis can include guiding the magnetic field component with a magnetic field converter comprising a low coercivity metal, for example, mu-metal.

In some embodiments, the first and second axes are transverse to one another. This can be used to couple three-axis magnetic field strength patterns into a magnetometer array formed to sense in only one or two axes. This can cause the magnetometers to detect three axis magnetic fields and allow the magnetic pattern analysis circuit to generate three axis magnetic field images.

In other embodiments, the first and second axes are parallel to one another. This can be used to concentrate magnetic field strength across each magnetometer.

Figure 21:
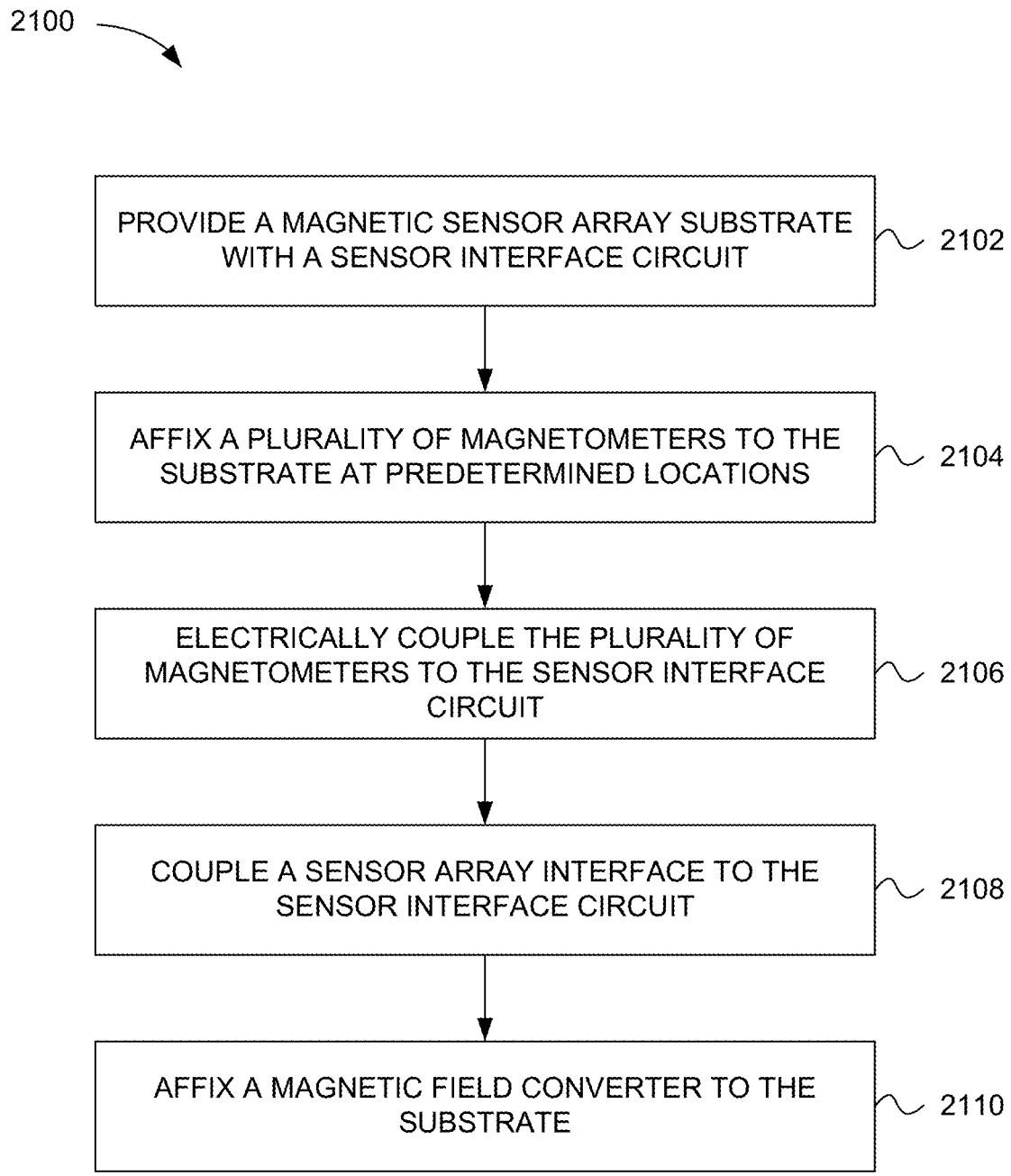
FIG. 21 is a flow chart showing a method for making a magnetic sensor array, according to an embodiment.

FIG. 21 is a flow chart showing a method 2100 for making a magnetic sensor array, according to an embodiment. Beginning with step 2102, a substrate including a sensor interface circuit is provided. In step 2104, a plurality of magnetometers are affixed to the substrate at respective predetermined locations. The plurality of magnetometers can be unpackaged magnetometers. Proceeding to step 2106, each of the magnetometers is electrically coupled to the sensor interface circuit. In an embodiment, electrically coupling each of the magnetometers to the sensor interface circuit is performed by wire bonding. In another embodiment, the magnetometers are electrically coupled to the sensor interface circuit by surface mount reflow.

In an embodiment, affixing the plurality of magnetometers to the substrate in step 2104 and electrically coupling each of the magnetometers to the sensor interface circuit in step 2106 is performed simultaneously by bonding each magnetometer to at least one bonding pad that is in electrical continuity with a portion of the sensor interface circuit.

Proceeding to step 2108, a sensor array interface is coupled to the sensor interface circuit.

Optionally, the method 2100 can include step 2110, wherein a magnetic field converter is affixed to the substrate. The magnetic field converter can include a stamped and punched high permeability metal sheet, such as may be seen in FIGS. 14-16, for example.

Figure 22:
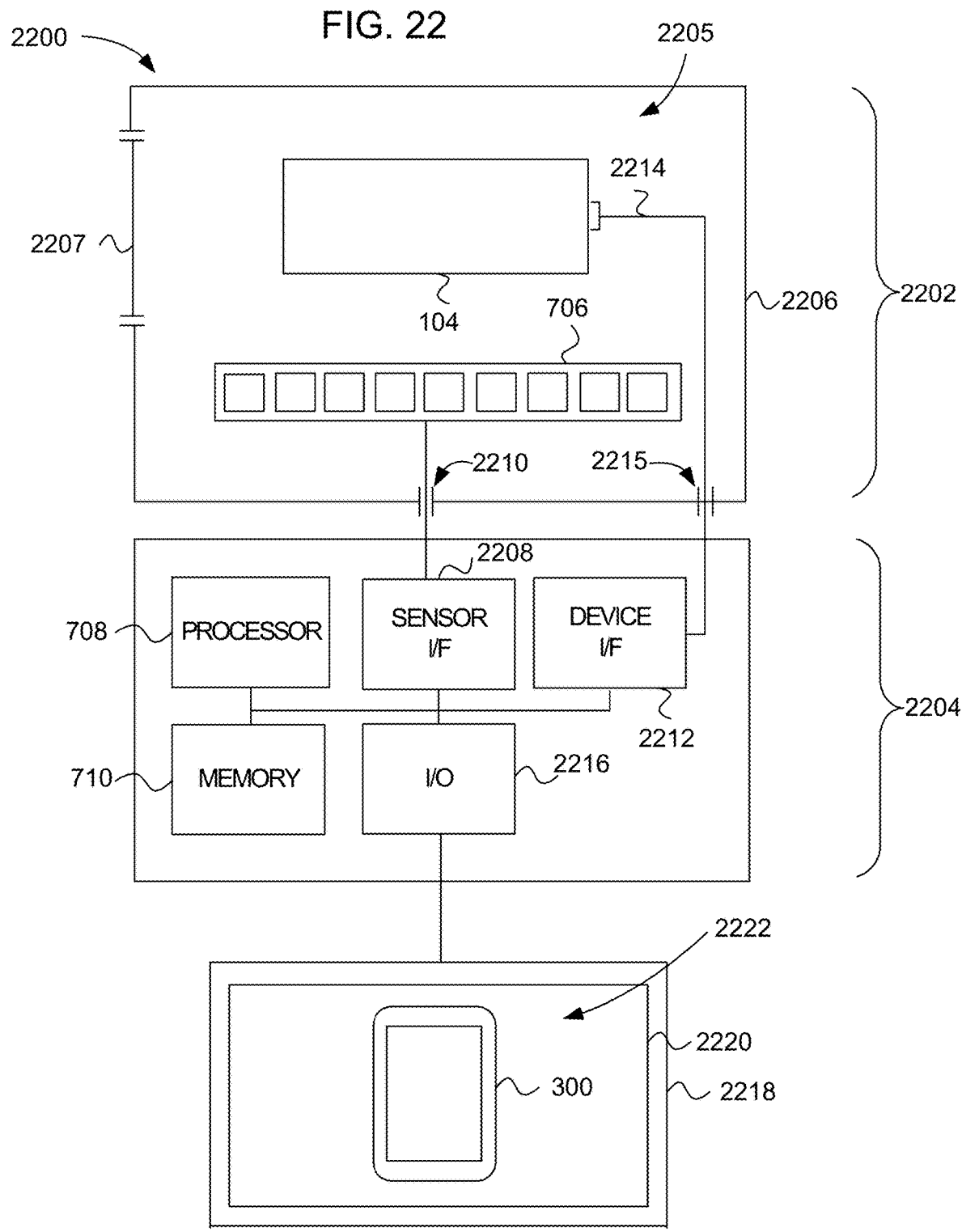
FIG. 22 is a block diagram of an electronic device test system, according to an embodiment.

FIG. 22 is a block diagram of an electronic device test system 2200, according to an embodiment. The electronic device test system 2200 includes a magnetometer array 706 including a plurality of magnetometers aligned to receive an instantaneous magnetic field pattern from an electronic device 104 in a magnetic field measurement region 2202. A test circuit 2204 is operatively coupled to the magnetometer array and configured to receive signals or data from the magnetometer array 706. The test circuit 2204 is configured to output, to an analysis device 2218, magnetic field data corresponding to the received signals or data. The analysis device 2218 includes a computer application configured to diagnose one or more hardware defects in the electronic device 104 as a function of the magnetic field data.

The electronic device test system 2200 may include a high magnetic permeability wall 2206 configured to exclude external magnetic fields from an internal cavity 2205 in which the electronic device 104 and magnetometer array 706 are disposed. The high magnetic permeability wall 2206 may be regarded as being a magnetic shield. The high magnetic permeability wall 2206 may be made from mu-metal, for example.

The high magnetic permeability wall 2206 may define an opening for receiving the electronic device 104. The electronic device test system 2200 may include a door or drawer front 2207 configured to close the opening defined by the high magnetic permeability wall 2206 to substantially enclose the internal cavity 2205.

The test region 2202 may includes a test platform (e.g., see 704, FIG. 7) configured to physically hold the electronic device 104.

The test circuit 2204 may include a microprocessor or microcontroller 708, a computer memory 710 operatively coupled to the microprocessor or microcontroller 708, and a sensor interface 2208 operatively coupled to the microprocessor or microcontroller 708 and computer memory 710, the sensor interface 2208 being operatively coupled to the magnetometer array 706 by a cable routed through a via 2210 in the high magnetic permeability wall 2206.

The test circuit 2204 may further include a device interface 2212 configured to provide a logical interface to the electronic device 104. The microprocessor or microcontroller 708, the computer memory 710, and the device interface 2212 may be configured to cooperate to control the electronic device 104 to enter one or more states. The one or more states may each correspond to a nominal magnetic field emission pattern emitted by the electronic device 104.

The test circuit 2204 may be configured to output state information and output magnetic field data corresponding to one or more instantaneous magnetic field patterns to the analysis device 2218 via a data interface 2216. The analysis device 2218 may be configured to compare one or more of a sequence of instantaneous magnetic field patterns detected by the magnetometer array 706 to corresponding one or more of a sequence of nominal magnetic field emission patterns corresponding to the one or more states. The analysis device 2218 may be configured to output electronic device 104 diagnosis information to a user via a graphical user interface 2222 displayed on an electronic display 2220, the diagnosis information corresponding to the comparison between the one or more nominal magnetic field emission pattern and the one or more instantaneous (measured) magnetic field emission pattern.

The analysis device 2218 may include an electronic display 2220 configured to display a graphical user interface 2222. The graphical user interface 2222 may be configured to at least periodically display a testing control object 300 configured to receive user input to control selection of a state to drive the electronic device 104 to enter.

The electronic device test system 2200 may further include the analysis device 2218. The electronic device test system 2200 may further include the computer application for running on the analysis device 2218. The analysis device 2218 may include a computer or a tablet computer.

While various aspects and embodiments have been disclosed herein, other aspects and embodiments are contemplated. The various aspects and embodiments disclosed herein are for purposes of illustration and are not intended to be limiting, with the true scope and spirit being indicated by the following claims.

What is claimed is:

1. A method, comprising:
   receiving an electronic device on a test platform of an electronic circuit triage system;
   measuring a magnetic field pattern from the electronic device;
   comparing the measured magnetic field pattern to one or more reference magnetic field patterns;
   determining a condition of the electronic device based on the comparison of the measured magnetic field pattern to the one or more reference magnetic field patterns; and
   outputting an indication of the condition to a user.

2. The method of claim 1, further comprising:
   receiving, into the electronic circuit triage system, a model designation for the electronic device; and
   fetching the one or more reference magnetic field patterns in accordance with the model designation.

3. The method of claim 2, wherein the model designation identifies a make or model of the electronic device.

4. The method of claim 3, wherein the electronic device is a mobile phone.

5. The method of claim 2, wherein the one or more reference magnetic field patterns include a plurality of reference magnetic field patterns.

6. The method of claim 1, wherein each reference magnetic field pattern corresponds to a nominal condition, a condition requiring repair, a condition corresponding to disablement of an electronic device subsystem, a condition requiring battery charging, or a condition indicating battery degradation.

7. The method of claim 1, further comprising:
   capturing one or more reference images of the electronic device; and
   determining an orientation and a location of the electronic device relative to the test platform;
   wherein comparing the measured magnetic field pattern to the one or more reference magnetic field patterns includes compensating for the orientation and the location of the electronic device relative to the test platform.

8. The method of claim 1, further comprising:
   transmitting a signal to the electronic device to attempt to cause the electronic device to enter one or more activated states;
   wherein measuring the magnetic field pattern from the electronic device includes measuring the magnetic field pattern while the electronic device is in each of the one or more activated states.

9. The method of claim 1, further comprising receiving a selection of a component of the electronic device for testing, wherein the one or more reference images correspond to the selected component.

10. The method of claim 9, wherein the selected component includes one or more of:
    a battery of the electronic device;
    a battery charging circuit of the electronic device;
    a memory of the electronic device;
    a display of the electronic device; and
    a power management system of the electronic device.

11. The method of claim 1, wherein the outputting the indication of the condition to the user includes displaying the indication on the display of the electronic circuit triage system.

12. An electronic circuit triage system, comprising:
    a test platform configured to receive an electronic device;
    one or more arrays of magnetic sensors collectively positioned and configured to sense magnetic field characteristics indicative of a magnetic field pattern from the electronic device when the electronic device is positioned on the test platform; and
    a microprocessor coupled to the one or more arrays of magnetic sensors and configured to compare the magnetic field pattern to one or more reference magnetic field patterns and to diagnose a condition of the electronic device based on a comparison of the magnetic field pattern to the one or more reference magnetic field patterns.

13. The electronic circuit triage system of claim 12, further comprising a memory configured to store the one or more reference magnetic field patterns, wherein the microprocessor is configured to access the one or more reference magnetic field patterns from the memory.

14. The electronic circuit triage system of claim 13, further comprising a user interface configured to receive a model designation indicating a model of the electronic device and to output a condition of the electronic device to a user.

15. The electronic circuit triage system of claim 14, wherein the microprocessor selects the one or more reference magnetic field patterns based on the model designation.

16. The electronic circuit triage system of claim 15, wherein the user interface receives a selection of a component of the electronic device, wherein the one or more reference magnetic field patterns are selected by the microprocessor based on the selected component and the model designation.

17. The electronic circuit triage system of claim 14, wherein the microprocessor is configured to execute computer instructions to interrogate and receive signals indicative of the magnetic field pattern from the magnetic sensors.

18. The electronic circuit triage system of claim 17, wherein the microprocessor is configured to:
   generate the magnetic field pattern based on indications of magnetic field strengths and directions from the one or more arrays of magnetic sensors,
   diagnose the condition of the electronic device by inferring the condition of the electronic device by selecting a best fit between the magnetic field pattern and the one or more reference magnetic field patterns; and
   output the inferred condition to the user via the user interface.

19. A method for performing triage on an electronic device, comprising:
   receiving into a test system from an interface a model designator for an electronic device;
   fetching one or more reference magnetic field patterns corresponding to the electronic device;
   receiving the electronic device on a test platform;
   measuring a magnetic field pattern proximate to and relative to the electronic device;
   comparing the measured magnetic field pattern to the one or more reference magnetic field patterns;
   inferring a condition of the electronic device as a function of a correspondence of the measured magnetic field pattern to the one or more reference magnetic field patterns; and
   outputting the inferred condition to a user.

20. The method of claim 19, wherein the one or more reference magnetic field patterns comprises a plurality of reference magnetic field patterns.

21. The method of claim 19, wherein each reference magnetic field pattern corresponds to a nominal condition, a condition requiring repair, a condition corresponding to disablement of an electronic device subsystem, a condition requiring battery charging, or a condition indicating battery degradation.

22. The method of claim 19, further comprising:
   capturing an image of the electronic device; and
   determining an orientation and location of the electronic device relative to the test platform;
   wherein comparing the measured magnetic field pattern to the one or more reference magnetic field patterns includes compensating for the orientation and location of the electronic device relative to the test platform.

23. The method of claim 19, further comprising:
   transmitting a signal to the electronic device to attempt to cause the electronic device to enter one or more activated states;
   wherein measuring the magnetic field pattern proximate to and relative to the electronic device includes measuring the magnetic field pattern while the electronic device is in each of the one or more activated states.

* * * * *